(12) United States Patent
Devilliers

(10) Patent No.: US 12,327,726 B2
(45) Date of Patent: Jun. 10, 2025

(54) WET-DRY BILAYER RESIST DUAL TONE EXPOSURE

(71) Applicant: Tokyo Electron Limited, Tokyo (JP)

(72) Inventor: Anton J. Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 663 days.

(21) Appl. No.: 17/735,707

(22) Filed: May 3, 2022

(65) Prior Publication Data

US 2022/0351966 A1 Nov. 3, 2022

Related U.S. Application Data

(60) Provisional application No. 63/183,129, filed on May 3, 2021, provisional application No. 63/183,130, filed on May 3, 2021, provisional application No. 63/183,128, filed on May 3, 2021.

(51) Int. Cl.
| | |
|---|---|
| *H01L 21/027* | (2006.01) |
| *G03F 7/00* | (2006.01) |
| *G03F 7/09* | (2006.01) |
| *H01L 21/311* | (2006.01) |

(52) U.S. Cl.
CPC ...... *H01L 21/0276* (2013.01); *H01L 21/0274* (2013.01); *H01L 21/31133* (2013.01); *H01L 21/31138* (2013.01); *H01L 21/31144* (2013.01); *G03F 7/094* (2013.01); *G03F 7/70466* (2013.01)

(58) Field of Classification Search
CPC ............ H01L 21/0276; H01L 21/0274; H01L 21/31133; H01L 21/31138; H01L 21/31144; G03F 7/094; G03F 7/70466; G03F 7/0035; G03F 7/095; G03F 7/167; G03F 7/2024; G03F 7/203; G03F 7/36; G03F 7/40
USPC ............................ 430/5, 311, 313, 327, 326
See application file for complete search history.

(56) References Cited

U.S. PATENT DOCUMENTS

| | | | |
|---|---|---|---|
| 2007/0148598 A1* | 6/2007 | Colburn | G03F 1/50 430/394 |
| 2008/0214011 A1* | 9/2008 | Colburn | G03F 1/50 430/312 |
| 2019/0148146 A1* | 5/2019 | Lin | G03F 7/095 438/703 |

(Continued)

*Primary Examiner* — Caleen O Sullivan
(74) *Attorney, Agent, or Firm* — Oblon, McClelland, Maier & Neustadt, L.L.P.

(57) ABSTRACT

A patterning method includes forming a multilayer photoresist stack on a substrate. The multilayer photoresist stack includes a first layer of a wet photoresist, deposited by spin-on deposition, over a second layer of a dry photoresist, deposited by vapor deposition. The multilayer photoresist stack is exposed to a first pattern of actinic radiation including relative, spatially-varying doses of actinic radiation and including high-dose regions, mid-dose regions and low-dose regions. The multilayer photoresist stack and the first pattern of actinic radiation are configured such that after the exposing the multilayer photoresist stack to the first pattern of actinic radiation, in the high-dose regions, developability of both the first layer and the second layer is changed; in the mid-dose regions, developability of the first layer is changed while developability of the second layer is unchanged; in the low-dose regions, developability of both the first layer and the second layer is unchanged.

20 Claims, 13 Drawing Sheets

(56) References Cited

U.S. PATENT DOCUMENTS

2020/0411317 A1\* 12/2020 Ecton .................. H01L 21/4846
2022/0350246 A1\* 11/2022 Devilliers ......... H01L 21/31144
2022/0350247 A1\* 11/2022 Devilliers ................. G03F 7/40

\* cited by examiner

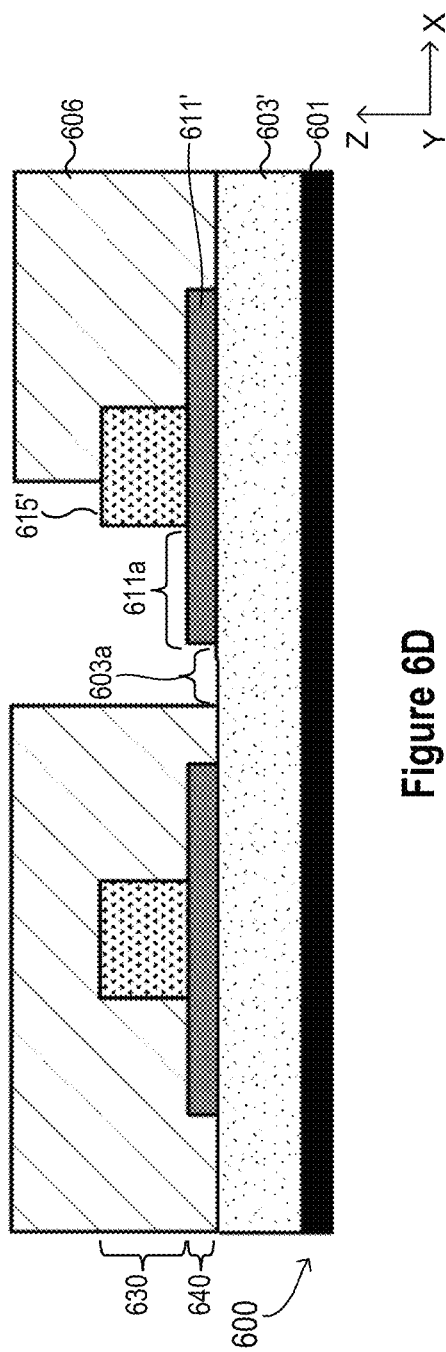
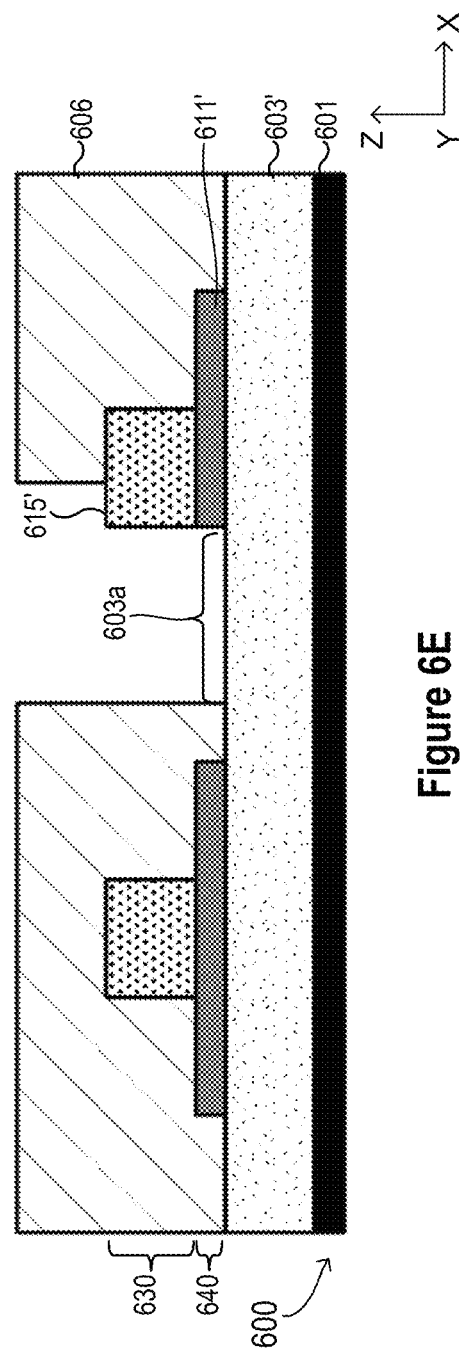

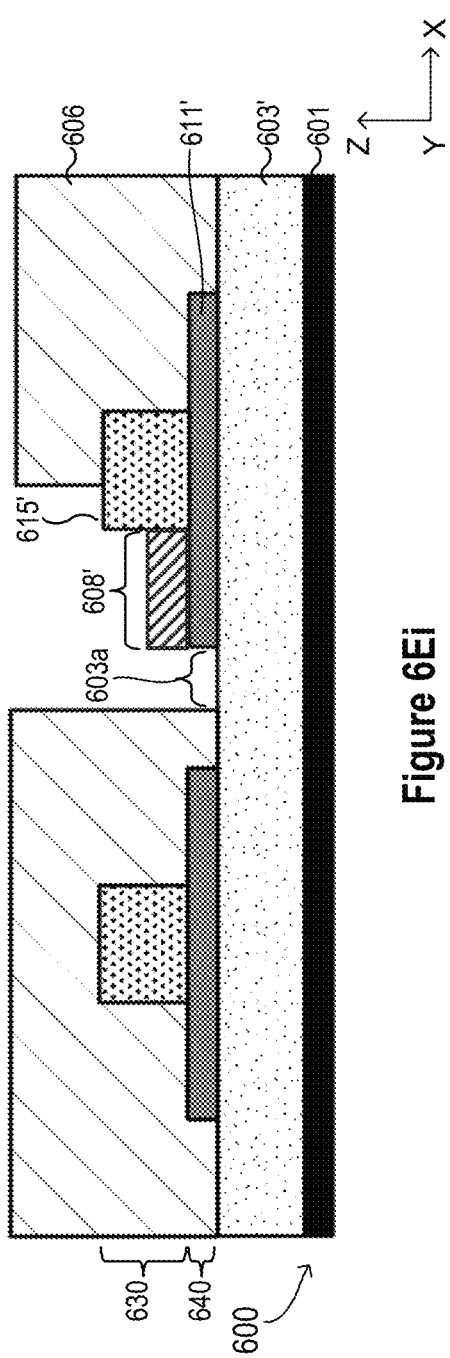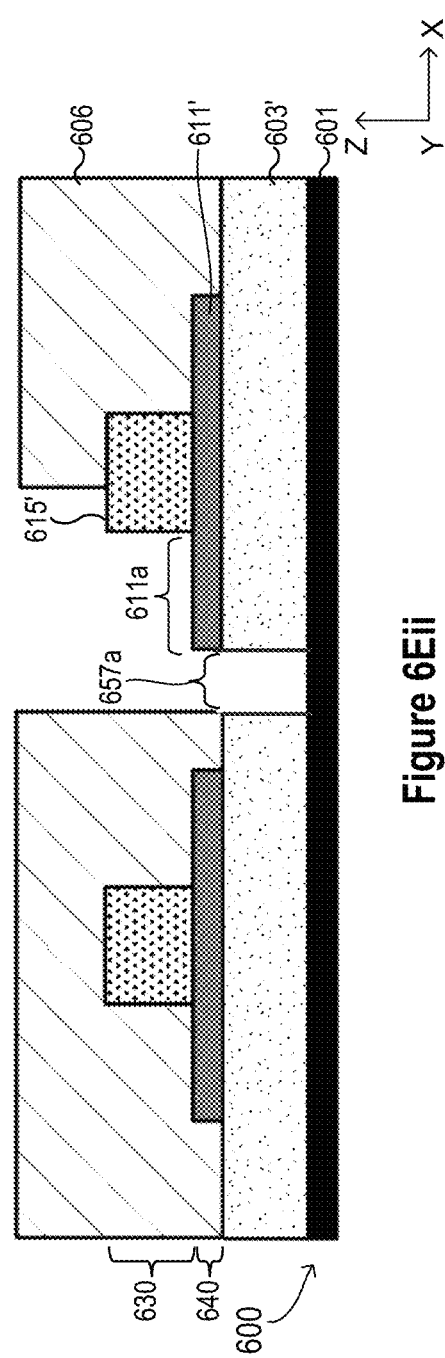

WET-DRY BILAYER RESIST DUAL TONE EXPOSURE

INCORPORATION BY REFERENCE

This present disclosure claims the benefit of U.S. Provisional Applications Nos. 63/183,128, 63/183,129 and 63/183,130 filed on May 3, 2021, each of which is incorporated herein by reference in its entirety.

FIELD OF THE INVENTION

This disclosure relates generally to methods of microfabrication and more specifically to lithography and patterning.

BACKGROUND

In material processing methodologies (such as photolithography), creating patterned layers comprises the application of a thin layer of radiation-sensitive material, such as a photoresist, to a working surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system such as a scanner or stepper tool. This exposure can then be followed by the removal of irradiated regions of the radiation-sensitive material or non-irradiated regions using a developing solvent depending on a photoresist tone and developer tone. This mask layer may comprise multiple sub-layers.

SUMMARY

The present disclosure relates to a method of patterning a substrate.

Aspect (1) includes a method of patterning a substrate. The method includes forming a multilayer photoresist stack on a substrate. The multilayer photoresist stack includes a first layer of a wet photoresist deposited by spin-on deposition, and a second layer of a dry photoresist deposited by vapor deposition. The first layer is positioned over the second layer. The multilayer photoresist stack is exposed to a first pattern of actinic radiation which includes relative, spatially-varying doses of actinic radiation. The first pattern of actinic radiation includes high-dose regions, mid-dose regions and low-dose regions. The multilayer photoresist stack and the first pattern of actinic radiation are configured such that after the exposing the multilayer photoresist stack to the first pattern of actinic radiation, in the high-dose regions, developability of both the first layer and the second layer is changed; in the mid-dose regions, developability of the first layer is changed while developability of the second layer is unchanged; in the low-dose regions, developability of both the first layer and the second layer is unchanged.

Aspect (2) includes the method of aspect (1), wherein the first layer and the second layer are sensitive to actinic radiation of a same wavelength.

Aspect (3) includes the method of aspect (2), wherein the same wavelength is between 10 and 124 nanometers.

Aspect (4) includes the method of aspect (3), wherein the same wavelength is 13.5 nanometers.

Aspect (5) includes the method of aspect (1), further including developing the first layer to form a first relief pattern and developing the second layer to form a second relief pattern, which results in uncovering portions of an underlying layer of a third material. The first relief pattern and the second relief pattern together form a combined relief pattern.

Aspect (6) includes the method of aspect (5), further including executing a selective patterning process for uncovered portions of one or two of the wet photoresist, the dry photoresist and the third material.

Aspect (7) includes the method of aspect (6), further including forming a patterned layer on the substrate to expose selected areas of the substrate to the selective patterning process.

Aspect (8) includes the method of aspect (6), wherein the executing the selective patterning process includes selectively depositing a fourth material on the uncovered portions of one or two of the wet photoresist, the dry photoresist and the third material.

Aspect (9) includes the method of aspect (6), wherein the executing the selective patterning process includes selectively etching the uncovered portions of one or two of the wet photoresist, the dry photoresist and the third material.

Aspect (10) includes the method of aspect (6), wherein the executing the selective patterning process includes selectively replacing the uncovered portions of one or two of the wet photoresist, the dry photoresist and the third material with a fourth material.

Aspect (11) includes the method of aspect (6), further including transferring the combined relief pattern into the underlying layer by anisotropic etch.

Aspect (12) includes the method of aspect (6), wherein the selective patterning process is executed for the uncovered portions of the dry photoresist.

Aspect (13) includes the method of aspect (5), further including etching one or more intermediate layers between the first layer and the second layer using the first relief pattern as an etch mask.

Aspect (14) includes the method of aspect (13), wherein the etching the one or more intermediate layers includes etching an anti-reflective coating layer.

Aspect (15) includes the method of aspect (5), further including exposing the multilayer photoresist stack to a second pattern of actinic radiation.

Aspect (16) includes the method of aspect (5), wherein the developing the first layer includes a vapor-phase removal of developable portions of the first layer or includes using a liquid developer to remove developable portions of the first layer. The developing the second layer includes a vapor-phase removal of developable portions of the second layer or includes using a liquid developer to remove developable portions of the second layer.

Aspect (17) includes the method of aspect (1), wherein after the exposing the multilayer photoresist stack to the first pattern of actinic radiation, in the high-dose regions and the mid-dose regions, the first layer is configured to become developable. In the high-dose regions, the second layer is configured to become developable.

Aspect (18) includes the method of aspect (1), wherein the first pattern of actinic radiation includes a dose gradient that is substantially sinusoidal in a plane perpendicular to a working surface of the substrate.

Aspect (19) includes a method of patterning a substrate. The method includes forming a multilayer photoresist stack on a substrate. The multilayer photoresist stack includes a dry photoresist layer deposited by vapor deposition, and a wet photoresist layer deposited by spin-on deposition. The wet photoresist layer is positioned over the dry photoresist layer. The multilayer photoresist stack is exposed to a pattern of actinic radiation. The pattern of actinic radiation includes differing relative doses of actinic radiation at spatial locations on the substrate include high-dose regions, mid-dose regions and low-dose regions. A composition of the multilayer photoresist stack is selected such that as a result of exposure to the pattern of actinic radiation, in the high-dose regions, developability of both the dry photoresist layer and the wet photoresist layer is unchanged; in the mid-dose regions, developability of the wet photoresist layer is changed while developability of the dry photoresist layer is unchanged; in the low-dose regions, developability of both the dry photoresist layer and the wet photoresist layer is changed.

Aspect (20) includes the method of aspect (19), wherein the wet photoresist layer and the dry photoresist layer are both sensitive to actinic radiation using a 13.5 nm wavelength light.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 2D' shows a top view of the substrate in FIG. 2D, in accordance with exemplary embodiments of the present disclosure.

FIG. 2E' shows a top view of the substrate in FIG. 2E, in accordance with exemplary embodiments of the present disclosure.

FIG. 4C' shows a top view of the substrate in FIG. 4C, in accordance with exemplary embodiments of the present disclosure.

FIG. 4D' shows a top view of the substrate in FIG. 4D, in accordance with exemplary embodiments of the present disclosure.

FIGS. 6A, 6B, 6C, 6D and 6E show vertical cross-sectional views of a substrate at various intermediate steps of patterning, in accordance with exemplary embodiments of the present disclosure.

FIG. 6B' shows a waveform representation of exposure intensity in FIG. 6B, in accordance with exemplary embodiments of the present disclosure.

FIG. 6Ei shows a vertical cross-sectional view of the substrate in FIG. 6E, in accordance with another embodiment of the present disclosure.

FIG. 6Eii shows a vertical cross-sectional view of the substrate in FIG. 6E, in accordance with yet another embodiment of the present disclosure.

DETAILED DESCRIPTION

Figure 1:
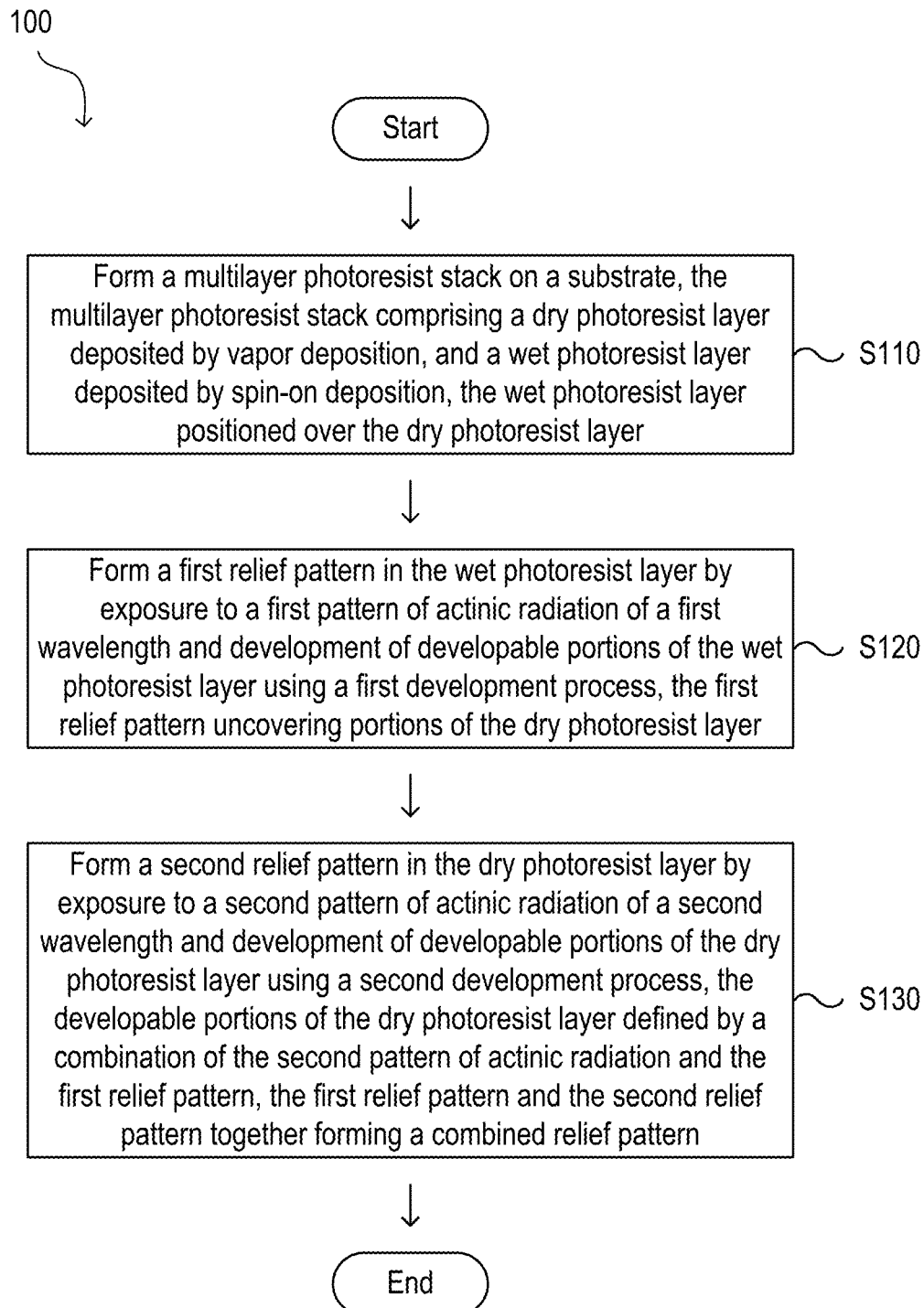
FIG. 1 shows a flow chart of a process for patterning a substrate, in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Conventional lithographic techniques for exposing a pattern of radiation or light onto a substrate have various challenges that limit a size of features exposed, and limit pitch or spacing between exposed features. One technology to extend lithographic patterning is extreme ultraviolet (EUV) lithography (EUVL). EUVL has had many challenges that keep it from being used extensively in high volume manufacturing. One challenge is species of photoresist film to use. EUV photoresist films include "wet resist" (also referred to as wet photoresist, wet deposited resist and wet deposited photoresist) and "dry resist" (also referred to as dry photoresist, dry deposited resist and dry deposited photoresist). Wet photoresist films are deposited by spin-on deposition. Photoresist in a solvent (in a liquid or wet form)

is deposited on a surface of a wafer. The wafer is spun at high rotational velocity to cause the dispensed photoresist to cover a surface of the wafer. The solvent is evaporated and the spin-on resist film is baked. At this point the wet resist film can be exposed to a pattern of EUV radiation. Solubility-shifting agents within the wet resist can then cause a shift or change in solubility in response to an exposure to EUV radiation. The solubility change can be either from insoluble to soluble, or from soluble to insoluble depending on tone of resist and developer used. Developing the wet resist film results in a relief pattern. This pattern, however, can suffer from line collapse and relatively short height of film.

Another species of photoresist that can be used with EUVL is so called dry resist. A dry resist is a photoresist that is deposited by vapor deposition without spin coating a liquid composition. The vapor deposition can include, but is not limited to, chemical vapor deposition, physical vapor deposition, atomic layer deposition, epitaxial growth (e.g. molecular beam epitaxy), and the like. Both wet and dry EUV resist typically include a metal or metal oxide. After vapor deposition of the dry resist, the dry resist can be exposed to a pattern of EUV radiation. This causes a shift in the ability of a dry resist to be developed, that is, this changes the EUV resist's developability. Developability covers any technique to develop or remove a portion of the dry resist. There are different ways to develop a dry EUV resist film. This can depend on whether the EUV exposure creates cross-linking or breaks bonds. One technique is to use a developer (liquid) that dissolves either the exposed dry resist or dissolves the unexposed dry resist. Another technique is to execute a vapor-phase removal process or dry etching (e.g. plasma etching, ion beam etching, reactive ion etching, etc.). Dry resist has advantages in pattern material strength, but still suffers from artifacts of the EUVL exposure.

One challenge with EUVL patterning is image fidelity. EUVL exposures for cuts are meant to be a square or rectangle, but the result is usually not a crisp rectangle and is often described as an elongated or floppy jellybean with fuzzy ends. As can be appreciated, having printed shapes with fuzzy ends can result in printed shapes being too long or too short. This can lead to failures in corresponding devices being micro-fabricated, such as transistors.

Techniques herein, however, solve the issue of fuzzy and unreliable EUV patterning. Techniques herein include a multilayer photoresist stack or at least two different species of photoresists. Specifically, this includes a multilayer resist stack in which a dry resist film is deposited, and then a wet resist film is deposited over the dry resist film. The wet resist film can be sensitive to EUV radiation or UV radiation, such as 193 nm exposure. The combination of a dry resist and a wet resist enables EUV lithography to pattern accurately and reliably. Without the wet resist film, EUV pattern ends can be fuzzy and inaccurate. In one embodiment, the wet resist film is exposed and developed into a relief pattern. For example, a 193 nm exposure, wet (immersion lithography) or dry, can be executed. With the wet resist film now forming a relief pattern, portions of the dry resist are uncovered. At this point the substrate is exposed to a pattern of EUV radiation. Openings (such as trenches) of the wet resist relief pattern can be relatively small, which can be 20-190 nanometers. This gap is too small for 193 nm radiation to pass through, but the wavelength of EUV exposure (typically 13.5 nm) is short enough to travel in the trenches (between lines of the wet resist). The lines of wet photoresist can provide the benefit of truncating or blocking the fuzzy ends of an EUV exposure. For example, an EUV line or rectangle is designed to extend longer than a width of a trench of the wet resist material. The central body of the EUV line then gets exposed into the uncovered dry resist, while the wet resist relief pattern blocks the fuzzy ends from being printed. The dry resist film can then be developed. The combined pattern can then be transferred into an underlying layer or used for location-specific selective deposition.

This disclosure relates to patterning thin films and various layers on a substrate. Such patterning includes patterning for fabricating semiconductor devices within a photolithographic patterning scheme.

According to some aspects of the disclosure, this invention includes patterning technology that improves efficacy of transferring patterns to substrates. This patterning technology can encompass resist species that are multilayered from more than one resist technology or resist species, and that are used together in a double patterning scheme. For example, a layer of dry deposited resist is deposited on a substrate, and then a layer of wet deposited resist is deposited on top of the dry resist.

This bilayer resist stack is beneficial because the wet deposited resist can be exposed with a conventional 193 nm exposure while the dry deposited resist underneath can remain untouched or unaffected by the 193 nm exposure. Then a cut mask, for example, can be completed using an EUV exposure thereby positioning the cuts in situ into the dry deposited resist where the wet deposited resist provides one-dimensional lines and spaces, which can be preferred in the imaging conditions to optimize illumination. Then an EUV exposure can be used for its strength, that is, providing cuts. In this example, a final transfer etch can be executed, or one or more selective patterning processes (e.g. selective deposition, selective removal, selective replacement, etc.) can be executed to reverse or partially reverse a pattern. As can be appreciated, this wet and dry bilayer resist stack has many alternative flows, process schemes, and multilayer structures.

Wet deposited photoresist films (also referred to as wet resist films) are known. Wet resist films are deposited by spin coating. Wet deposited photoresist films include wet resists and are typically organic films including a polymer, epoxy or resin as well as a photo-active agent. Responsive to light or actinic radiation, a wet resist can polymerize, decompose, or crosslink or otherwise change a solubility relative to a particular solvent.

Dry deposited photoresist films (also referred to as dry resist films) are known. Dry resist films are so called because they are not deposited in liquid form (like wet resists), but deposited from gas or vapor form resulting in a resist film without a solvent to be baked out as in the wet resist films. Deposition of dry resist films can be accomplished by atomic layer deposition (ALD), chemical vapor deposition (CVD), physical vapor deposition (PVD) or other dry deposition technologies. Dry resist films are typically homogeneous films stable to air and visible light and often contain a metal or metals to assist with reacting to EUV photons. Subsequent bake or anneal steps may be needed to induce crosslinking and densification. Developable areas of a dry resist can be soluble to a liquid developer. Developable areas of a dry resist can be also reactive or developable to a vapor phase chemical mixture for removal. In contrast to typical spin-on processes, dry deposited film thickness can increase linearly with deposition time and thus be easily controlled.

Techniques herein apply to any method or structure in which more than one resist species is used within a stack (patterning stack or layer stack). In some embodiments, the dry resist layer is positioned underneath the wet resist layer and is used in a combination with multiple masks instead of just one mask, such as multiple cut masks. A top pattern can have any two-dimensional (2D) geometry to augment a bottom mask. Techniques herein can be combined with other technologies such as an anti-spacer flow to create a pitch double top mask, which can then be cleaned up or further defined by a second or subsequent mask. The second mask can be modulated by its actinic radiation difference because of 193 nm and 13.5 nm radiation used generically between the two exposures. Other wavelengths can be encompassed as needed. Alternatively, a dose can be modulated in which a particular dose affects a first pattern/film without affecting a second film in a bilayer resist film stack in two 193 nm exposures (for example). In this example, a relatively high dose of 193 nm radiation is what reveals or creates cuts, and then a one-dimensional 193 nm exposure is used for the lines and spaces.

Accordingly, techniques herein can apply to any patterning scheme, permutation or combination, in which two different genres or species or technologies of resist are used together. The two different species of resist differ in that they are mechanistically different. For example, dry resists can include a selective epitaxial layer, a gas-applied resist, a monolayer resist and/or a selective catalyzed resist, placed underneath a conventional spin-coated wet resist to form a bilayer resist scheme. This family of species combinations can be used herein.

Example embodiments provide any two-dimensional transfer of multilayer resist to a substrate whether it is directly from selective deposition, catalyzed selective deposition, a change in the catalyzed underlayer for the selective deposition, a direct etch, a metal etch, or a dielectric etch or substrate etch coming from a multiplicity of patterning that includes two layer species (wet resist and dry resist). In preferred embodiments, the wet resist is positioned on top of the dry resist, but embodiments can include a dry resist positioned on a wet resist for combined patterning. Embodiments can also include a first dry resist positioned on a second dry resist, which may further be positioned on a third dry resist. Herein, the first dry resist can be exposed to patterned 193 nm radiation to form lines and trenches between the lines. The second dry resist or the third dry resist may be exposed to patterned EUV radiation, for example to form cuts.

By way of a non-limiting example, a dry resist species is formed on a target layer. This target layer can be a temporary memorization layer or transfer layer or hardmask layer or other functional or intermediate layer for forming devices/structures. Then, on the dry resist layer, a conventional photoresist stack is formed. The conventional photoresist stack can include a bottom anti-reflective coating (BARC) layer with a wet deposited photoresist film (spin-coated) formed on the BARC layer. So there may be three layers in the stack or more. The anti-reflective coating (ARC) provides good mitigation for improved image fidelity and resolution for lithographic patterning, but an ARC layer is optional for this resist stack (dry resist, BARC on dry resist, and wet resist on BARC). At this point, a 193 nm patterned exposure is run/executed, which affects the wet resist film by forming a latent pattern within the wet resist film.

Any 193 nm (dry or immersion) or other exposure wavelength can be executed herein. In one example, a lithography tool with interferometric one-dimensional imaging, a "scan 1D" tool can be used to pattern the wet resist film. This results in one-dimensional lines across an exposure region. These can be very high precision lines. Certain 193 nm scanners can provide interferogram type grating patterns, which are run at or around 37 nanometers. With this example starting point, the resist layer stack is exposed and developed to form a relief pattern from the layer of wet photoresist (wet deposited photoresist). For embodiments using a BARC, a BARC etch can then be executed to uncover the layer of dry resist. Alternatively, a layer of developable BARC (D-BARC) can be used so that uncovered BARC regions can be removed using a developing solvent and coater-developer tool. At this point, the wet resist layer forms a first relief pattern with uncovered portions of the layer of BARC also being removed so that the first relief pattern is formed over the layer of dry resist with portions of the layer of dry resist uncovered by the first relief pattern.

The dry resist is formulated to react to EUV photons or photons of a different wavelength. During the process of forming the wet resist relief pattern, the dry resist layer is unaffected. In other words, the layer of dry resist essentially ignored the exposure of the wet resist layer that used lesser energetic photons. At this point, the resist layer stack includes an intact dry resist layer with the wet resist layer defining a wet resist relief pattern over the dry resist layer. As is known, an ARC layer is entirely unnecessary for EUV exposure.

In some embodiments, a second patterned lithographic exposure or EUV exposure is executed. This second exposure is a lithographic patterned exposure in that the substrate (including the layer stack) is exposed to a second pattern of actinic radiation. Patterning of the radiation exposure can be mask-based or direct-write. For higher resolution imaging, typically a mask-based (photomask) exposure is executed. This second exposure can be used to further define a pattern for a composite pattern or double pattern or multi-pattern. For example, EUV can be used for cuts or line ends. Conventionally, forming lines and cuts would be a complicated process to form cuts in a transfer medium and into layers and films stacks to record the film stack and then rebuild a photoresist stack to form lines. With techniques herein, however, this conventional process is not required. With techniques herein, the dry resist is already positioned beneath the wet resist and is untouched or unaltered. Moreover, the dry resist is accessible between the lines of the wet resist relief pattern. That is, through trenches, holes, or other openings of the wet resist relief pattern, the dry resist layer is accessible (from above or a top-down perspective). This means that the upper relief pattern (lines) provides self-alignment for the cuts from the EUV exposure. Thus, one embodiment provides a self-aligned cut directly into the bilayer resist stack.

In some embodiments, the cuts or other exposure from EUV can "extend into" wet deposited photoresist material in the upper relief pattern. In other words, a relatively larger exposure (or a relatively lower-resolution exposure) can be executed that not only covers a target location but also extends beyond the target location, e.g. extending into or below lines of photoresist material in the upper/wet relief pattern. This can be an EUV exposure of more energetic photons at around 13.5 nm. The EUV exposure striking the dry resist film through openings defined by the upper relief pattern then becomes "soluble" or "developable" or otherwise removable in a subsequent dry develop step. Depending on the EUV resist composition, exposed regions may become cross-linked or insoluble or otherwise not removable in a particular development process as an alternative. In the dry develop chamber or module, the wet photoresist material can be essentially ignored by the dry develop process because wet resist development and dry resist development use different mechanisms. Accordingly, the dry development process removes portions of the dry resist that have been exposed to the pattern of EUV radiation and that are accessible through openings of the upper relief pattern.

Self-aligned cuts or other openings are thus formed with or in the layer of dry resist. These cuts or other openings are aligned with or positioned/formed relative to the wet relief pattern or using the upper relief pattern to assist with alignment. The result is cuts that are self-aligned to the same pattern or color (material) scheme in a same pedestalized layer and same planarization layer because a same stack is used for both the 193 nm exposure and the EUV exposure. Accordingly, a final result is a seamlessly integrated double patterning technique that uses both a dry deposited film and a wet deposited film for a superior double patterning process. Prior to techniques herein, double patterning has been problematic because both resist films were wet deposited resist films, and acid released from one film would affect the other film. EUV cuts on their own in dry films can be problematic for high fidelity imaging, but when a wet resist film is used on top of a dry resist film, sharp EUV cuts are finally enabled. Without the wet deposited resist film on top of the dry EUV resist film, EUV cuts can be inaccurate and inconsistent.

Accordingly, dry resist can be developed in the trenches of a wet resist relief pattern. EUV photons can travel within the relatively small trench space and expose the uncovered dry resist within the trench space. This is not typically done with twin or two 193 nm exposures because 193 nm light sees two line widths and the 193 nm printed lines by the first 193 nm can exposure block the second 193 nm exposure. One advantage of 13.5 nm (soft x-ray) exposure is that the 13.5 nm exposure can essentially ignore grating and blockages formed by a preceding 193 nm exposure. That is, although the grating is formed on the substrate, the grating (e.g. 193 nm printed lines) is significantly larger than the wavelength of EUV (13.5 nm), which means EUV wavelengths can very cleanly and effectively expose the dry resist film, ignoring the features above because of width of openings, and the EUV exposure will only expose the dry photoresist down in the trench. In other words, the EUV exposure will only expose uncovered portions of the dry photoresist and is thereby self-aligned. While the EUV radiation can traverse the trenches, the lines of wet resist can be configured to block or sufficiently attenuate EUV radiation so that the EUV radiation does not cause a developability shift directly under the wet resist.

This self-alignment with a wet resist can mitigate undesirable effects of EUV printing. For instance, EUV exposures for cuts are meant to be square or rectangular, but the result that is printed in a bare, dry resist pattern in related examples is often not a crisp square or rectangle. Instead, the printed result is often described as an elongated or floppy jellybean with fuzzy ends. This shape is not preferred and one reason why dry EUV resists by themselves are not reliable. With the wet resist film on top, however, the fuzzy ends are truncated, thereby providing a self-aligned cut. The result is a self-aligned cut in an EUV dry resist film, in which only a very bottom of the trench is exposed into a crisp slot. Conventional EUV suffers from line end pull back and line end variability. EUV cuts are typically a short line, with most of the variability on tips (or ends) of that line. This is an artifact that is part of EUV imaging. Putting the ends of the jelly bean on top of or below the 193 nm resist lines means that only the waist of the jellybean, or the center/middle portion of the line cut segment, is transferred by the EUV exposure. That is, the pattern of the EUV exposure overlaps with the 193 nm resist pattern in areas corresponding to the ends of the jellybean. During the EUV exposure, an uncovered portion of the dry resist corresponding to the waist of the jellybean is exposed while portions of the dry resist corresponding to the ends of the jelly bean are covered by the 193 nm resist lines and thus are not exposed. It is then this very well defined waist of the jellybean that defines the cut. Accordingly, using a wet resist film on top of a dry resist film can enable usable or well-defined EUV cuts. In related technology, the ends of the EUV cuts are variable, fuzzy, and hard to predict where they will land on the substrate, but techniques herein remove that variability. A lot of existing technology goes into the aspect ratio of those cuts. A lot of etch technology is used to help mitigate the fuzzy ends, but with a dry resist alone these techniques may not be satisfactory. Combining a wet resist with a dry resist, however, means that the line end variability is moot or ignored. With techniques herein, there is relaxed tolerance in a sense. The cuts (short exposure lines) can be designed to be a little longer than what would normally be printed, and then those variable and fuzzy ends fall over/below the 193 nm resist pattern, which essentially sharpens the effective EUV patterned exposure.

As can be appreciated, techniques herein can be applied to many microfabrication patterning purposes. For example, methods herein provide a self-aligned twin-resist-species self-aligned cut process for metallization with EUV and 193 nm lithography. Techniques herein can also be applied to polysilicon metallization. Other examples include dual damascene metallization with copper and other materials, or direct etching of ruthenium, as well as a patterning technique for active patterns for devices. Self-alignment for metals No. 1 and No. 2 and vias is another example application. Techniques herein can also be applied to truncation of fins and diffusion breaks and applications that benefit from a cut mask on either end quad definition of the shallow trench formation module up through the fin formation, or backend definition quads to complete first metal No. 1 pitch, or any metal N layers or between metal layers to enhance metal pitch capability. Techniques herein can be used for contacts as well, or any particular 2-dimensional transfer useful to a corresponding device.

Note that some EUV photons may pass through a wet resist film and affect the dry resist film, but exposure here can be inconsequential because the existence of the wet resist film above which fuzzy ends would land will block directional etch transfer of the combined pattern in a subsequent step. Moreover, wet resist is not completely transmissive, so there is attenuation of the EUV exposure. Even air is not transparent to EUV, which is why air is removed from EUV chambers. So the wet resist can help attenuate and truncate a portion of the EUV pattern that is not desired to be printed. Nevertheless, some EUV penetration here can be desirable to reduce scumming at the edges of the exposure. But most material of appreciable thickness will attenuate EUV.

As can be appreciated, many multilayer resist stacks are applicable herein. Alternative techniques herein include wet resist positioned on dry resist positioned on a wet resist; wet resist on wet resist on dry resist; wet resist on wet resist on wet resist on dry resist. Thus any N stack of photo chemistries (i.e. a stack of N resist layers, where N stands for the number of resist layers in the stack) can be included by techniques herein, with a combination of multiple species of resist. One species from the wet world (wet resists) and one species from the dry world (dry resists) in any permutation. With wet resist on dry resist on wet resist, for example, the dry resist film protects acid from the top wet resist film affecting the underlying wet resist film. As can be appreciated, more benefits are realized and resist stacks can be tailored to a corresponding microfabrication process.

Multilayer resist stacks herein can include intermediate layers and interfacial films, such as memorization layers, ARC films, et cetera. In related examples, with a twin resist stack on top, a direct current superposition freeze can freeze one layer of wet resist to use the underlying layer of wet resist. Accordingly, known photoresist tricks can be used over the layer dry resist in techniques herein. With wet resist and dry resist, there is now twin exposure capability without needing a freeze. Conventional freezes can be worked on top. Other conventional techniques include cross-linking thermal freeze, negative tone develop trenches with positive tone anti-spacer, etc. All those patterning techniques can be executed on top of the layer of dry deposited resist. And then this self-aligned self-cutting can be combined with whatever multi-patterning technique or mask formed on top (or below) a layer of dry deposited photoresist. As can be appreciated, many families and genres of application spaces can be enabled herein. In many embodiments herein, there is at least one family of a wet species of photoresist interacting with one family of a dry species of photoresist because a wet resist on top of a dry resist enables the dry resist exposure to be useful.

Other embodiments herein may not necessarily need an etch transfer. Instead of an etch transfer, a next patterning step after forming a composite pattern is to execute a selective patterning process, such as selective deposition, selective etching and selective replacement. Selective deposition of material is a process in which a specific material is deposited on surfaces of one (or more) material on a substrate without being deposited on surfaces of other materials (or another material) which are also exposed. The other materials can be in contact with and/or spaced apart from the deposited material. Such processes and materials are known. New selective deposition processes are also being developed. Selective deposition often uses vapor phase deposition, typically with a precursor. For example, there might be species of which a monolayer is deposited. The monolayer becomes a catalyst or a seed layer for selective deposition and then patterning continues.

After both wet deposited and dry deposited resist films are patterned and developed, there are surfaces uncovered of at least three different materials, including the wet resist, the dry resist and an underlying layer. Thus, a selective deposition process can be developed to be deposited on any one or two of the three different materials. In one embodiment, a selective deposition species is applied to the underlying layer. Then the wet and dry resists are exhumed, leaving the selectively deposited species on the substrate. In another embodiment, a material is selectively deposited on uncovered portions of the dry resist. Then the wet resist is removed and newly uncovered portions of the dry resist are removed while some of the dry resist remains and is covered by the selectively deposited material. This is one technique to generate a self-aligned keep mask. Thus, selective deposition used with combined patterns herein can enable tone inversion. Accordingly, there are many different integration schemes contemplated herein.

The so-called self-aligned block technique can also be used herein. The wet resist and the dry resist can be used as two colors (materials). A fill material between lines of wet resist from an anti-spacer flow can provide additional selectivity and form a multi-color layer, such as a multi-line layer. As soon as this other color/material (i.e. the fill material) is introduced, a multi-color patterning scheme can be enabled: A-B-C-B-A. For example, B can be the dry resist. Material A can be the wet resist, and Material C can be the fill material.

Self-aligned tri-color schemes can result in three quarters self-alignment by generating the A-B-C-B-A block pattern by a 193 nm exposure, which can be further patterned by an EUV exposure. For example, the 193 nm exposure could define the distance between resist lines. A wide trench is formed, for example between two lines of the wet resist, thus opening up the dry resist underneath. An EUV exposure is used to make the dry resist into a mesa and now with two exposures the relatively wider 193 features can be bridged within a trench with the EUV to get a higher definition and with two exposures an A-B-C-B-A self-aligned block pattern can be formed. That is, using a cut mask and a positive dry resist, a line cut can be formed between two lines defined by the 193 nm exposure. Using the same cut mask and a negative dry resist, however, a mesa can instead be formed that connects or bridges the two lines. Note that application with cuts is merely exemplary—any lithographic patterning can be used herein. With lines of two different materials on top of a layer of dry resist, this provides a self-aligned block with three-quarter overlay enhancement when crossing the lines perpendicularly with a third mask. Multi-line layers formed from the wet-dry bilayer resist stack, can provide self-aligned cutting or keeping in an isolated area for quarter pitch, half pitch, and three quarter pitch self-alignment. Accordingly, a self-aligned block structure can come right out of a twin exposure.

Embodiments can include various materials under the bilayer stack such as SiN under the dry resist. Also, no antireflective coating is needed for the dry resist because a 193 nm exposure will not affect the dry resist, and EUV resists do not need antireflective coatings because EUV photons have little reflectivity. Other embodiments can have a hardmask layer underneath with N and K tuned. An inorganic antireflective coating underneath can be used such as TiOx.

Some photoresist compositions are reactive/sensitive to two different wavelengths. For example, some photoresist compositions are reactive/sensitive to both EUV and 193 nm exposures. Techniques herein include different dose ranges. Full mix and match is thus enabled. Previously, there was no way to prevent one feature from fundamentally affecting the other. But now with wet and dry resists, patterning techniques can be separated by dose and/or acid. Now there is no concern about plasma exposure, which can degrade photoresist to one use. Location-specific areas of interest are provided based on photoresist type. An example embodiment is EUV pitch double metallization to provide a keep mask or mask defining circuit elements to keep.

Another benefit with the bilayer resist stack is that because the resist stack still has a dry resist, an increased dose can affect the dry resist. A different dose can be used for a keep mask as compared to a defeat mask. Embodiments can be used to enable selective deposition or defeat selective deposition.

Other embodiments include a dual tone exposure for patterning both layers of photoresist in a single exposure. In this embodiment, a photoresist stack is formed with a wet deposited resist layer formed over a dry deposited resist layer. The photoresist stack is exposed to a mask-based exposure having varied dose based on spatial location. This results in some areas receiving a high dose of radiation, other areas receiving a mid-dose of radiation, and other areas receiving a low dose (or no dose) of radiation, with dosage amounts relative to each other. Photoresist response can be dependent on dose control, and the amount of dose received controls whether there is a solubility/developability shift at layers of the photoresist stack.

Developability or solubility shift is dependent on composition of the resists as to whether a resist becomes developable or undevelopable after exposure to actinic radiation. In this embodiment, both resist layers can be configured to be sensitive to a same wavelength, such as EUV radiation. A single exposure can then demarcate a positive and negative tone at the same time. The reason that dual tone exposure attempts did not work prior to techniques herein is because it was not possible to separate the photoresist systems into regions that would not interfere with each other. There was a single photo acid, and it would blend together and diffuse through both wet resist layers, thus defeating dual tone exposure attempts. But with techniques herein, one resist is a dry deposited resist while the other resist is a wet deposited resist. These two resists are mechanistically different such that there is no interference. For example, a photo acid diffused from a polymer-based wet photoresist will not affect an underlying metal-based or metal-oxide-based dry photoresist.

Accordingly, this disclosure provides a method of dual tone exposure using different resist species. With a strong enough dose, the high-dose regions will reach and affect the underlying dry deposited resist through the wet deposited resist. The mid-dose regions will not have an intensity strong enough to affect solubility/developability of the dry deposited resist layer, but mid-dose regions have a sufficient dose to affect the wet deposited layer of photoresist. And then the low-dose regions have insufficient radiation to affect either layer of photoresist. For example, this exposure can include a dose gradient that is sinusoidal. This sinusoidal aspect is inherent with mask-based exposures of small scales. Accordingly, a composite pattern or relief pattern of two different resist layers can be formed from a single dual-tone EUV exposure.

FIG. 1 shows a flow chart of a process 100 for patterning a substrate, in accordance with exemplary embodiments of the present disclosure. FIGS. 2A, 2B, 2C, 2D and 2E show vertical cross-sectional views of a substrate 200 at various intermediate steps of a patterning process such as the process 100, in accordance with exemplary embodiments of the present disclosure.

The process 100 starts with Step S110 where a multilayer photoresist stack is formed on a substrate. The multilayer photoresist stack includes a dry photoresist layer deposited by vapor deposition, and a wet photoresist layer deposited by spin-on deposition. The wet photoresist layer is positioned over the dry photoresist layer.

Figure 2A:
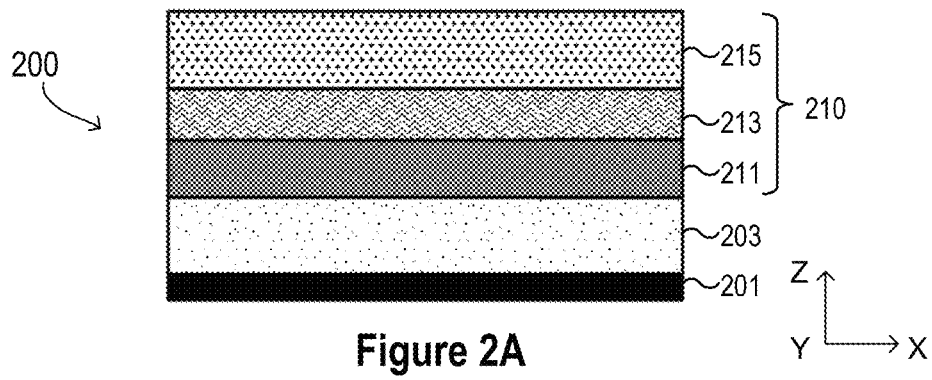
FIGS. 2A, 2B, 2C, 2D and 2E show vertical cross-sectional views of a substrate at various intermediate steps of patterning, in accordance with exemplary embodiments of the present disclosure.

FIG. 2A can show some embodiments of Step S110. As illustrated, the substrate 200 can include a wafer 201 (or a segment of a wafer) and a multilayer photoresist stack 210 formed over the wafer 201. Specifically, a dry photoresist layer 211 of the multilayer photoresist stack 210 is formed over the wafer 201 by vapor deposition. Then, a wet photoresist layer 215 of the multilayer photoresist stack 210 is formed over the dry photoresist layer 211 by spin-on deposition. Thus, the multilayer photoresist stack 210 is also referred to as a bilayer photoresist stack 210 in this example.

"Vapor deposition" as used herein generally refers to a deposition process in which a substrate (or a wafer, or the like) is exposed to one or more gas species that react, decompose and/or condense on the substrate to deposit a desired material thereon. Vapor deposition can include, but is not limited to, chemical vapor deposition (CVD), physical vapor deposition (PVD), atomic layer deposition (ALD), epitaxial growth (e.g. molecular beam epitaxy) and the like. In contrast to spin-on deposition, vapor deposition does not typically entail dissolving a photoresist in a liquid or solvent. Thus, a resist material deposited by vapor deposition is referred to as a dry resist, a dry photoresist, a dry deposited resist or a dry deposited photoresist, whereas a resist material deposited by spin-on deposition is referred to as a wet resist, a wet photoresist, a wet deposited resist or a wet deposited photoresist.

In the example of FIG. 2A, an anti-reflective coating (ARC) layer 213 is formed between the dry photoresist layer 211 and the wet photoresist layer 215. In another example (not shown), the wet photoresist layer 215 may be formed directly on top of (or in direct contact with) the dry photoresist layer 211. It should be understood that other intermediate layers and planarization films can be optionally formed. Further, in this embodiment, an underlying layer 203 is formed over the wafer 201 and below the bilayer photoresist stack 210. In alternative embodiments (not shown), the bilayer photoresist stack 210 can be formed directly on the wafer 201. For example, the bilayer photoresist stack 210 can be formed directly on bulk silicon.

As explained earlier, the multilayer photoresist stack 210 can include two or more photoresist layers which include at least one dry photoresist layer and at least one wet photoresist layer arranged in other combinations or permutations in alternative embodiments. Herein, the bilayer photoresist stack 210, which includes the dry photoresist layer 211 and the wet photoresist layer 215, is used for illustrative purposes throughout the examples of FIGS. 2A-2E.

Referring back to FIG. 1, the process 100 then proceeds to Step S120 by forming a first relief pattern in the wet photoresist layer by exposure to a first pattern of actinic radiation of a first wavelength and development of developable portions of the wet photoresist layer using a first development process. The first relief pattern uncovers portions of the dry photoresist layer.

Figure 2B:
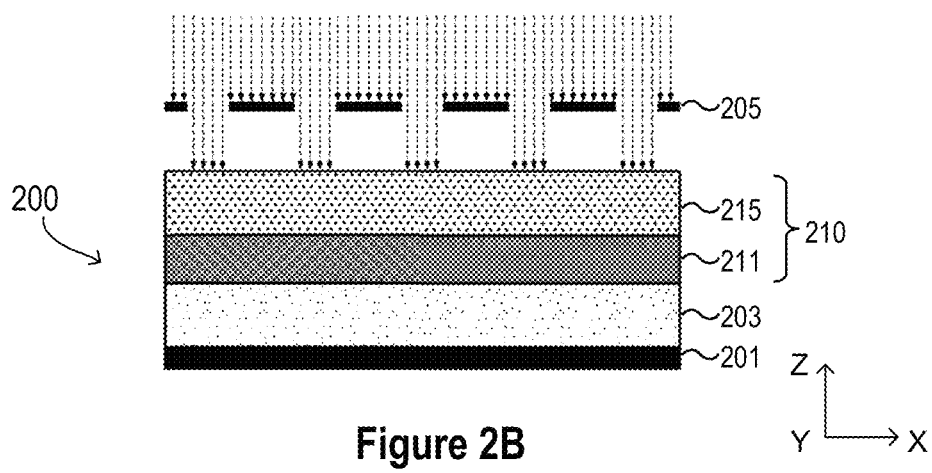
Figure 2C:
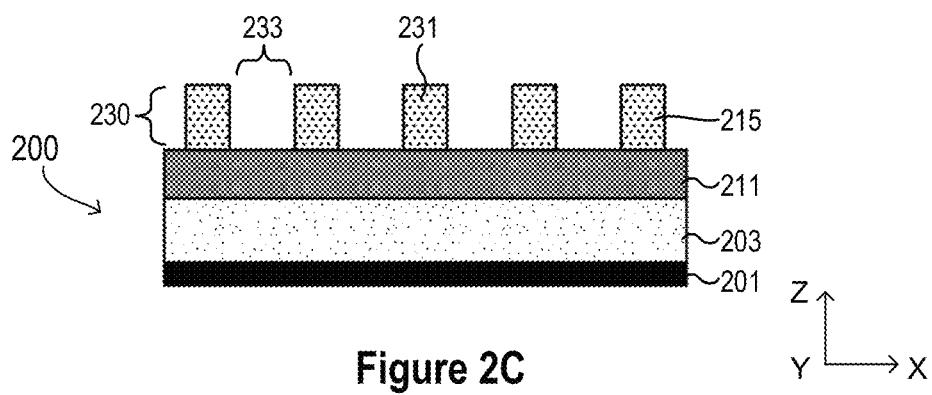

FIGS. 2B and 2C can show some embodiments of Step S120. In FIG. 2B, a masked-based exposure is executed using a first wavelength. That is, the wet photoresist layer 215 is exposed to a first pattern of actinic radiation of the first wavelength through a first mask 205. For example, the first wavelength can be between 124 and 400 nanometers. Particularly, any conventional wavelength can be used such as I-line, H-line, G-line, et cetera. Preferably, a 193 nm exposure is used, which can form features (e.g. lines or trenches) substantially smaller than 193 nm in width. For illustrative purposes, a line pattern of actinic radiation is shown. For simplicity purposes, the ARC layer 213 is not shown in FIG. 2B and hereinafter.

In FIG. 2C, the wet photoresist layer 215 is developed using a first development process, such as wet etch or dry etch, preferably using a developer, resulting in a first relief pattern 230 (or a wet deposited resist relief pattern). Therefore, the first relief pattern 230 uncovers the dry photoresist layer 211. For example, the first relief pattern 230 can include lines 231 (e.g. remaining portions of the wet photoresist layer 215), with trenches 233 formed between the lines 231. As a result, the dry photoresist layer 211 is uncovered through the trenches 233. It should be understood that in some embodiments when a bottom ARC (BARC) layer is used, the BARC layer can be etched or developed using the first relief pattern as an etch mask so that the dry photoresist layer 211 is uncovered. Similarly, in some embodiments, one or more intermediate layers between the wet photoresist layer 215 and the dry photoresist layer 211 can be removed using the first relief pattern as an etch mask.

In FIG. 1, at Step S130, a second relief pattern is formed in the dry photoresist layer by exposure to a second pattern of actinic radiation of a second wavelength and development of developable portions of the dry photoresist layer using a second development process. The developable portions of the dry photoresist layer are defined by a combination of the second pattern of actinic radiation and the first relief pattern. The first relief pattern and the second relief pattern together form a combined relief pattern.

Figure 2D:
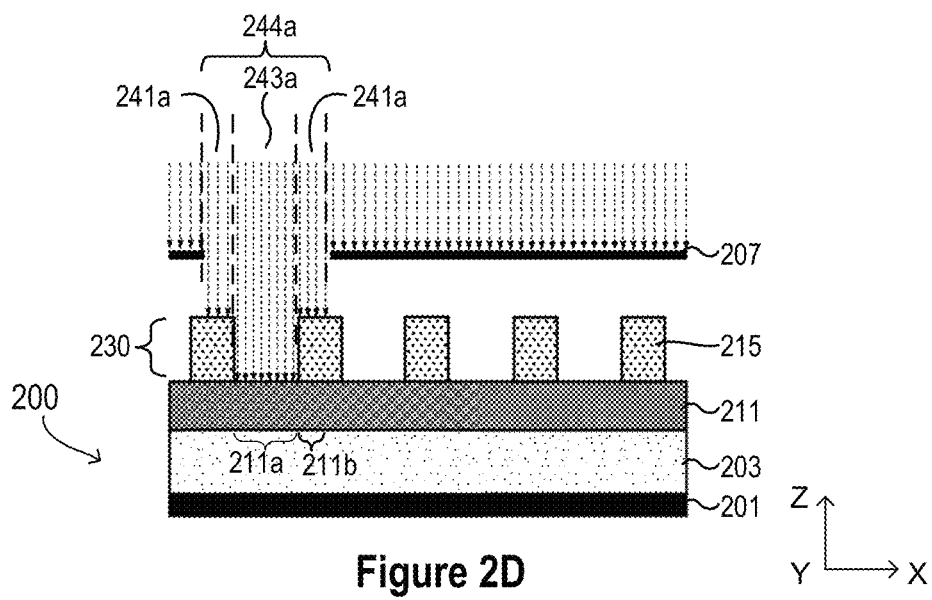
Figure 2D:
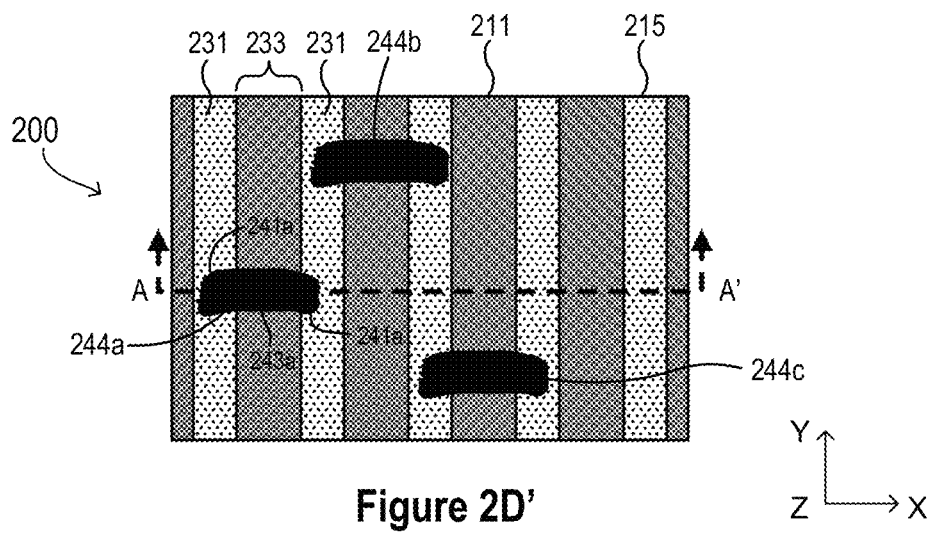
Figure 2E:
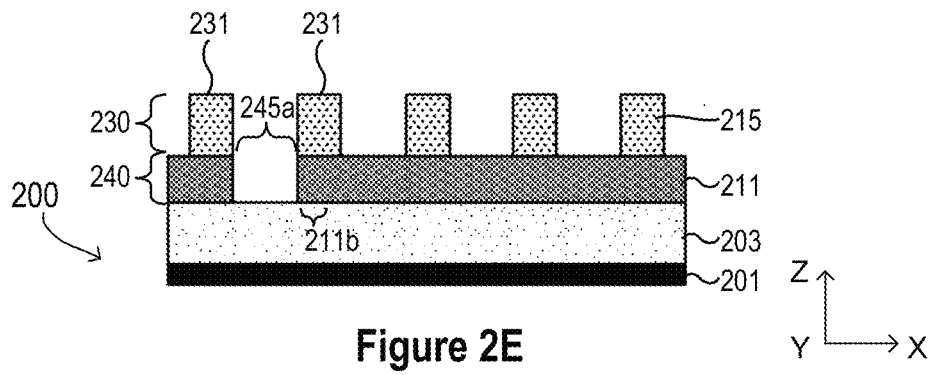
Figure 2E:
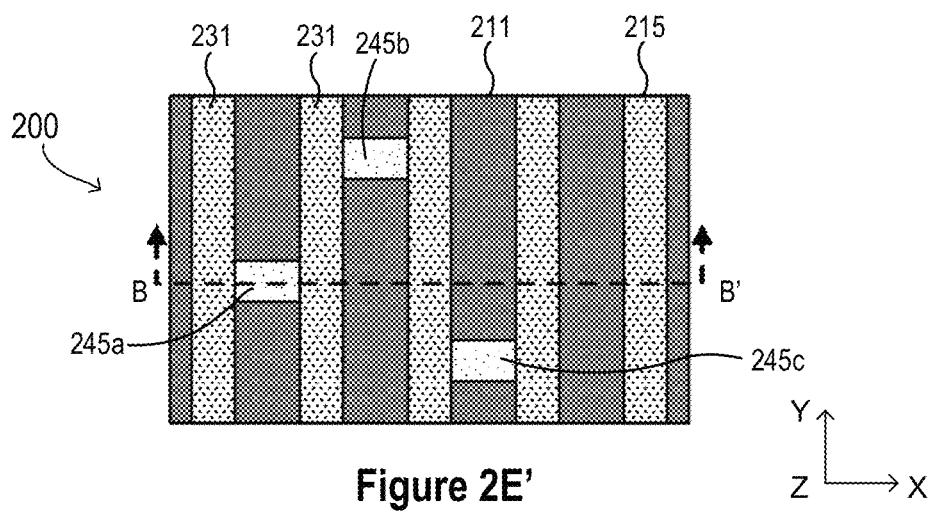

FIGS. 2D and 2E can show some embodiments of Step S130. FIGS. 2D' and 2E' respectively show top views of the substrate 200 in FIGS. 2D and 2E, in accordance with exemplary embodiments of the present disclosure.

In some embodiments, FIG. 2D shows a vertical cross-sectional view taken along the line cut AA' in FIG. 2D'. Herein, a second pattern of actinic radiation of a second wavelength is executed through a second mask 207. For example, the second wavelength can be between 10 and 124 nanometers. Particularly, a 13.5 nm exposure can be executed.

In the top view (FIG. 2D'), exposure regions (e.g. 244a, 244b and 244c) are shown in black. Note that the exposure regions can extend across respective trenches 233. Consider the exposure region 244a for example. The exposure region 244a includes a middle portion 243a and two opposing end portions 241a. The two opposing end portions 241a are configured to overlap with the first relief pattern 230 during exposure. That is, the two opposing end portions 241a overlap with respective lines 231 while the middle portion 243a is in an area corresponding to a respective trench 233 between the respective lines 231. As a result, developability of uncovered portions (e.g. 211a) of the dry photoresist layer 211, which are exposed to the second pattern of actinic radiation, is changed relative to a second development process, such as wet etch (e.g. using a developer) or dry etch (e.g. plasma etching, ion beam etching or reactive ion etching). In contrast, developability of covered portions (e.g. 211b) of the dry photoresist layer 211, albeit in the exposure regions (e.g. 244a), can remain unchanged relative to the second development process. This is because the respective lines 231 can be configured to block or sufficiently attenuate EUV radiation so that no developability shift may be induced underneath.

In some embodiments, FIG. 2E shows a vertical cross-sectional view taken along the line cut BB' in FIG. 2E'. Herein, the second development process is executed. In this example, the dry photoresist layer 211 includes a positive resist material. Consequently, the uncovered portions (e.g. 211a) of the dry photoresist layer 211 (i.e. regions that are in the exposure regions (e.g. 244a) and not covered by the first relief pattern 230) are removed by the second development process. In contrast, the covered portions (e.g. 211b) of the dry photoresist layer 211 in the exposure regions (e.g. 244a) are not removed. Hence, developable portions of the dry photoresist layer 211 are defined by a combination of the second pattern of actinic radiation and the first relief pattern 230.

As a result, a second relief pattern 240 is formed in the dry photoresist layer 211. The second relief pattern 240 can include cuts (e.g. 245a, 245b and 245c) self-aligned between respective lines 231. For example, the cut 245a corresponds to the middle portion 243a of the exposure region 244a. It is worth noting that the exposure region 244a is truncated: the two opposing end portions 241a are not printed in the dry photoresist layer 211 while a pattern of the middle portion 243a is transferred to the dry photoresist layer 211. Therefore, fuzzy ends of EUV cuts, which are a common problem in related technology, can be truncated by using techniques herein.

Further, the first relief pattern 230 and the second relief pattern 240 combined together can form a combined relief pattern for further processing, for example to etch transfer highly accurate, self-aligned shapes or cuts. For instance, an anisotropic etch process can be executed that transfers the combined relief pattern into an underlying layer, such as the underlying layer 203, positioned below the dry photoresist layer 211.

Still referring to FIGS. 2A-2E and 2D'-2E', the first wavelength being 198 nanometers and the second wavelength being 13.5 nanometers are merely used herein for illustrative purposes. As has been mentioned before, the first wavelength can be between 124 and 400 nanometers, and the second wavelength can be between 10 and 124 nanometers. Of course other wavelengths or other combinations of wavelengths can also be used. For example, the first wavelength and the second wavelength can both be in the EUV range, such as 13.5 nanometers. Accordingly, the first relief pattern may have defects at line ends, but middle portions of lines can be utilized to truncate the second pattern of actinic radiation.

Figure 3:
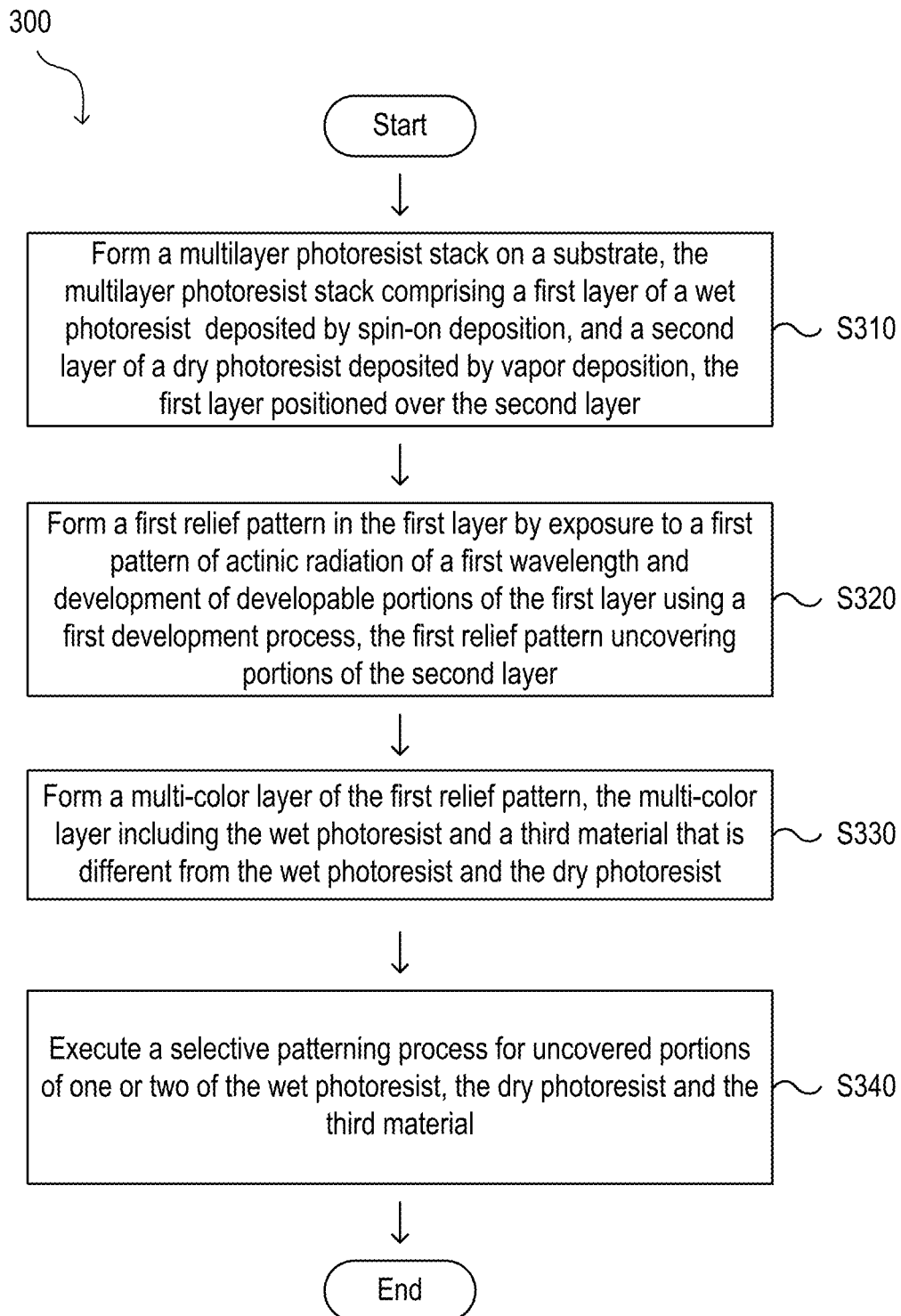
FIG. 3 shows a flow chart of a process for patterning a substrate, in accordance with another embodiment of the present disclosure.

FIG. 3 shows a flow chart of a process 300 for patterning a substrate, in accordance with another embodiment of the present disclosure. FIGS. 4A, 4B, 4C and 4D show vertical cross-sectional views of a substrate 400, and FIG. 4E' shows a top view of the substrate 400, at various intermediate steps of a patterning process such as the process 300, in accordance with exemplary embodiments of the present disclosure.

The process 300 starts with Step S310 where a multilayer photoresist stack is formed on a substrate. The multilayer photoresist stack includes a first layer of a wet photoresist deposited by spin-on deposition, and a second layer of a dry photoresist deposited by vapor deposition. The first layer is positioned over the second layer. In some embodiments, Step S310 can correspond to Step S110.

Figure 4A:
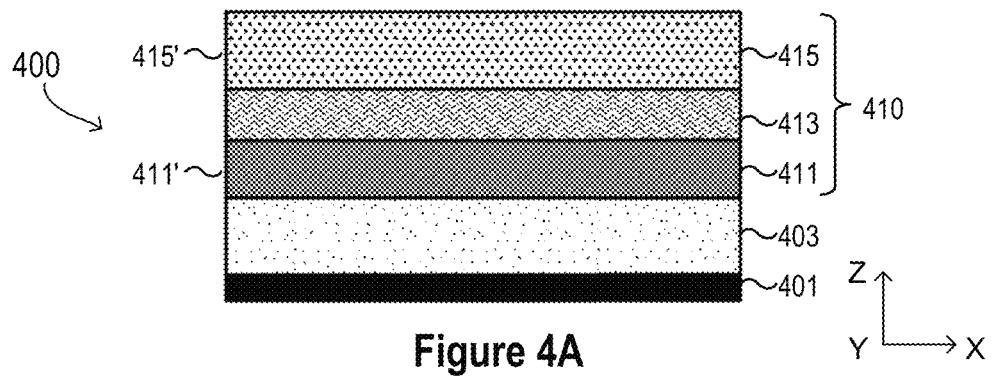
FIGS. 4A, 4B, 4C and 4D show vertical cross-sectional views of a substrate, and FIG. 4E' shows a top view of the substrate, at various intermediate steps of patterning, in accordance with exemplary embodiments of the present disclosure.

FIG. 4A can show some embodiments of Step S310. As illustrated, the substrate 400 includes a wafer 401 and a multilayer photoresist stack 410 formed over the wafer 401. Specifically, a dry photoresist layer 411 of the multilayer photoresist stack 410 is formed on the substrate 400 by vapor deposition. Then, a wet photoresist layer 415 of the multilayer photoresist stack 410 is formed over the dry photoresist layer 411 by spin-on deposition. Thus, the multilayer photoresist stack 410 is also referred to as a bilayer photoresist stack 410 in this example. In addition, the multilayer photoresist stack 410 may further include an ARC layer 413 (not shown in subsequent figures), and an underlying layer 403 may optionally be disposed below the multilayer photoresist stack 410.

In some embodiments, FIG. 4A can correspond to FIG. 2A. Specifically, the wafer 401 corresponds to the wafer 201. The underlying layer 403 corresponds to the underlying layer 203. The multilayer photoresist stack 410 corresponds to the multilayer photoresist stack 210. The dry photoresist layer 411 corresponds to the dry photoresist layer 211. The wet photoresist layer 415 corresponds to the wet photoresist layer 215. The ARC layer 413 corresponds to the ARC layer 213. Note that the wet photoresist layer 415 includes a wet photoresist 415' and is also referred to as a first layer 415 of the wet photoresist 415'. The dry photoresist layer 411 includes a dry photoresist 411' and is also referred to as a second layer 411 of the dry photoresist 411'.

The process 300 in FIG. 3 then proceeds to Step S320 by forming a first relief pattern in the first layer by exposure to a first pattern of actinic radiation of a first wavelength and development of developable portions of the first layer using a first development process. The first relief pattern uncovers portions of the second layer. In some embodiments, Step S320 can correspond to Step S120.

Figure 4B:
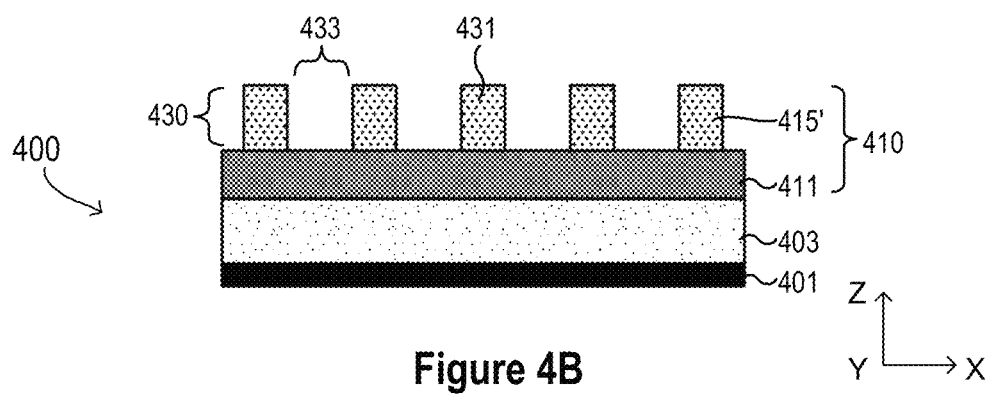

FIG. 4B can show some embodiments of Step S320. Accordingly, FIG. 4B can correspond to FIG. 2C. That is, the multilayer photoresist stack 410 can go through processes similar to what is shown in FIGS. 2B and 2C. The descriptions have been provided above and will be omitted herein for simplicity purposes. As a result, a first relief pattern 430, which corresponds to the first relief pattern 230, is formed in the first layer 415. The first relief pattern 430 can include lines 431 which correspond to the lines 231. Trenches 433, which correspond to the trenches 233, are formed between the lines 431.

Referring back to FIG. 1, at Step S330, a multi-color (multi-material) layer of the first relief pattern is formed. The multi-color layer includes the wet photoresist and a third material that is different from the wet photoresist and the dry photoresist.

Figure 4C:
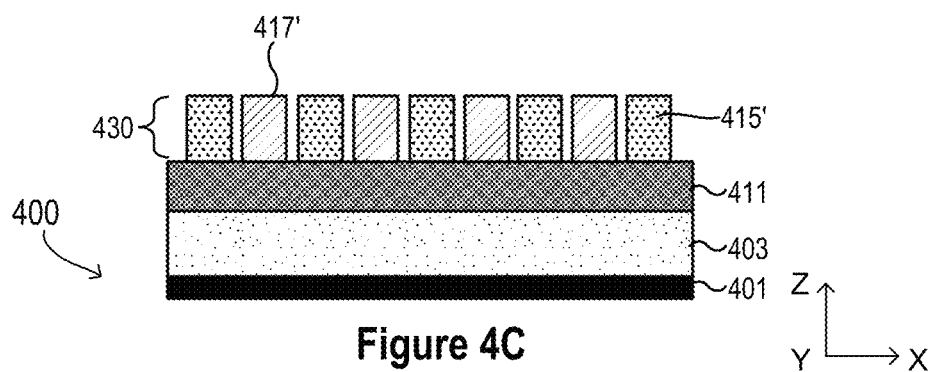
Figure 4C:
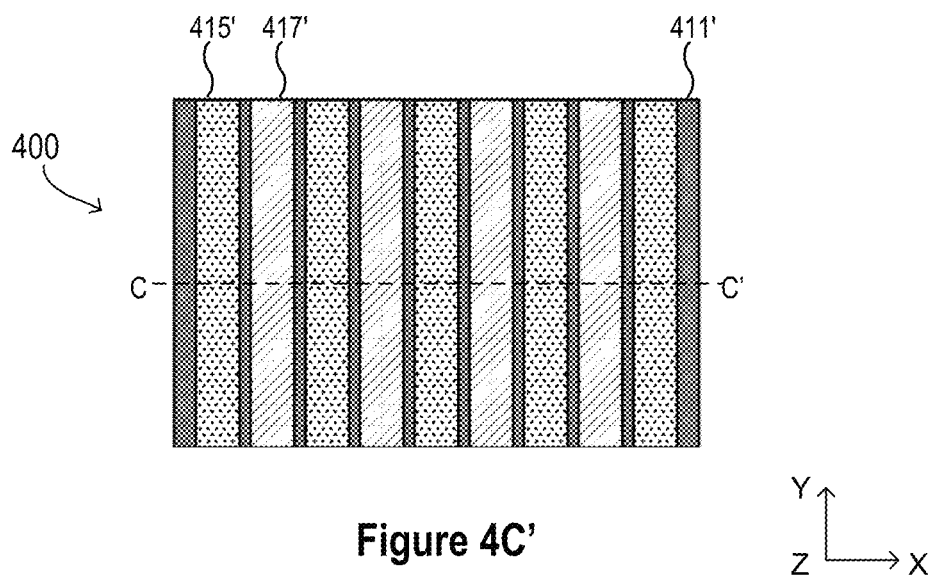

FIGS. 4C and 4C' can show some embodiments of Step S330. Particularly, FIG. 4C can show a vertical cross-sectional view taken along the line cut CC' in FIG. 4C'. As shown, a multi-color layer is formed that includes the wet photoresist 415' and a third material 417' which is different from the wet photoresist 415' and the dry photoresist 411'. For example, the third material 417' may have a different etch resistance to a particular etch process, relative to the wet photoresist 415' and the dry photoresist 411'. The third material 417 may also have a different deposition selectivity in a selective deposition process, relative to the wet photoresist 415' and the dry photoresist 411'.

In some embodiments, the multi-color layer is a multi-line layer including lines of the wet photoresist 415' and lines of the third material 417' as demonstrated in the top view (FIG. 4C'). The lines of the wet photoresist 415' and the lines of the third material 417' are arranged alternatingly in the multi-color layer and spaced apart from one another, thus leaving portions of the dry photoresist 411' uncovered. The result is that three lines or colors of material are accessible from a top view or directional etching perspective. Any of these lines or materials can be etched independent of the others. For example, the dry photoresist 411' can be etched at this time in order to transfer very thin lines (or openings) into a homogeneous dry resist material or into an underlying layer. This multi-line layer is referred to as a self-aligned block. In this embodiment, the wet photoresist is material A, the dry photoresist material B, and the third material C. A repeating pattern of alternating lines is thus formed, with a pattern of A-B-C-B-A (A-B-C-B is repeated). To go from A to A or C to C, there are three intermediate lines of material. To go from B to B there is one intermediate line of material. Thus, three quarters pitch self-alignment or one quarter pitch self-alignment can be provided with this scheme.

In some embodiments, the multi-color layer is formed by an anti-spacer process (not shown). The anti-spacer process may include filling openings (e.g. the trenches 433 in FIG. 4B) of the wet photoresist 415' with an overcoat material (e.g. the third material 417'), diffusing a solubility-shifting agent (e.g. an acid) across a boundary of the wet photoresist 415' and developing developable portions of the wet photoresist 415' or developable portions of the overcoat material (e.g. the third material 417'). In one embodiment, after lines of 193 nm resist (e.g. the lines of the wet photoresist 415') are formed, a developable overcoat (not shown) is deposited. Acid within the 193 nm printed lines can then be diffused out of the lines and into the overcoat material. That is, the acid diffuses from the lines of the wet photoresist 415' to the overcoat material. The length of diffusion can be precisely controlled by bake time and temperature. The diffusion length from the boundary of the 193 nm lines into the overcoat material becomes soluble and is thereafter developed. This leaves alternating lines of the wet photoresist 415' and the third material 417', with the dry photoresist 411' accessible (uncovered) between the lines.

In another embodiment, after the lines of the wet photoresist 415' are formed, an acid may be diffused from the third material 417' to the lines of the wet photoresist 415'. The diffusion length from the boundary of the 193 nm lines into the 193 nm lines becomes soluble and is thereafter developed. In yet another embodiment, after the lines of the wet photoresist 415' are formed, an anti-spacer generator (ASG) coating (not shown) may be formed on the substrate 400. The solubility-shifting agent is diffused from the ASG coating to the lines of the wet photoresist 415' and baked, before the ASG coating is rinsed off and the third material 417' is formed on the substrate 400.

Additionally, in some examples, diffusion of the solubility-shifting agent across the boundary of the wet photoresist 415', whether into or out of the wet photoresist 415', can further be spatially controlled by a (second) patterned 193 nm exposure (not shown).

The process 300 in FIG. 3 then proceeds to Step S340 by executing a selective patterning process for uncovered portions of one or two of the wet photoresist, the dry photoresist and the third material. In some embodiments, a patterned layer is formed on the substrate to protect certain areas of the substrate from the selective patterning process.

Figure 4D:
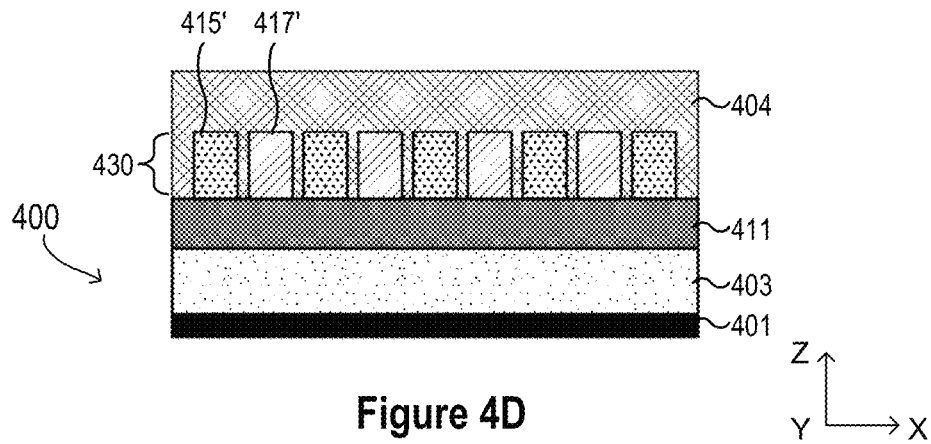
Figure 4D:
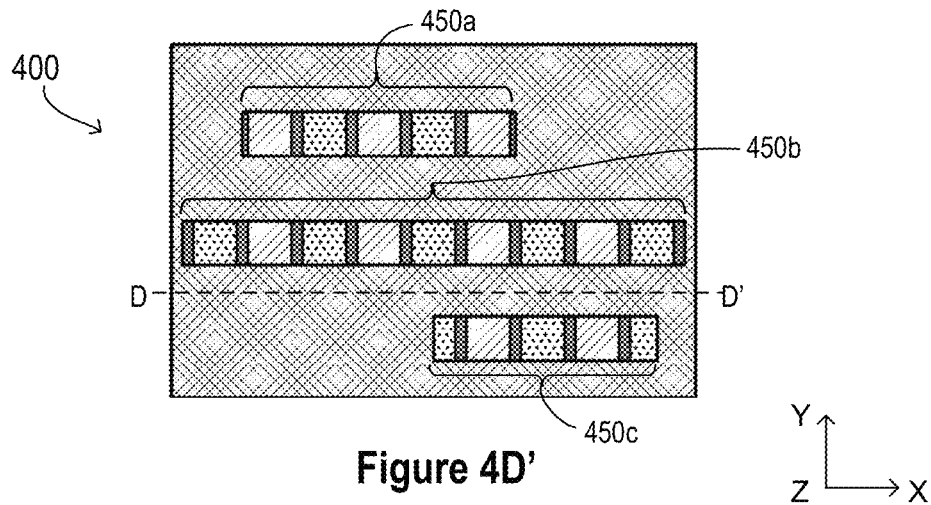

FIGS. 4D, 4D' and 4E' can show some embodiments of Step S340. Particularly, FIG. 4D' can show a cross-sectional view taken along the line cut DD' in FIG. 4D. As illustrated, the self-aligned block can be further functionalized using another etch mask formed on the substrate 400 to open up sections of the multi-line layer. That is, a patterned layer 404 (e.g. a relief pattern or etch mask) can be formed on the substrate 400. Consequently, the first relief pattern 430 is partially covered with some openings (e.g. 450a, 450b and 450c). Note that slots of three different lengths are shown herein for illustrative purposes, but openings of any shapes can be formed.

A selective patterning process can then be executed for the self-aligned block. In one embodiment, the selective patterning process includes selectively depositing a fourth material on the uncovered portions of one or two of the wet photoresist 415', the dry photoresist 411' and the third material 417'. In another embodiment, the selective patterning process includes selectively etching the uncovered portions of one or two of the wet photoresist 415', the dry photoresist 411' and the third material 417'. In yet another embodiment, the selective patterning process includes selectively replacing the uncovered portions of one or two of the wet photoresist 415', the dry photoresist 411' and the third material 417' with a fourth material. In other words, a selective removal process is executed before the fourth material is formed or deposited.

Figure 4E:
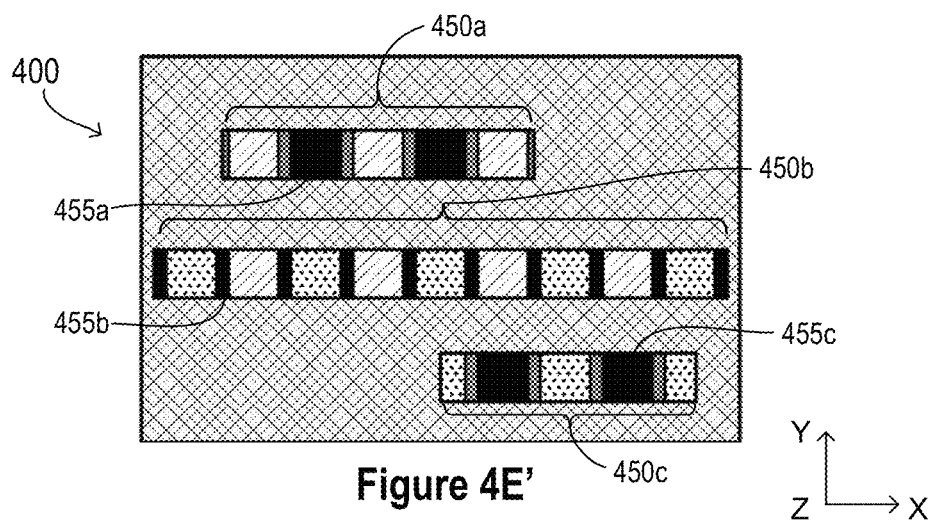

FIG. 4E' demonstrates example results of the selective patterning process. In the opening 450a, the lines of the wet photoresist 415' can be targeted for etch removal, selective deposition or selective replacement, as shown by black shapes 455a. In the opening 450b, the lines of the dry photoresist 411' can be targeted for etch removal, selective deposition or selective replacement, as shown by black shapes 455b. In the opening 450c, the lines of the third material 417' can be targeted for etch removal, selective deposition or selective replacement, as shown by black shapes 455c. Note that the results shown in the openings 450a, 450b and 450c are independent of each other, meaning that the black shapes 455a, 455b and 455c are formed in separate processes (not concurrently) and shown together for illustrative purposes.

While not shown, in some embodiments, a second relief pattern is formed in the second layer 411 by exposure to a second pattern of actinic radiation of a second wavelength and development of developable portions of the second layer 411 using a second development process. For example, the second relief pattern can be formed by processes similar to what is shown in FIGS. 2D, 2D', 2E and 2E'. The descriptions have been provided above and will be omitted herein for simplicity purposes. Further, the second relief pattern can be formed before or after Step S340 in FIG. 3, e.g. before or after the selective patterning process in FIGS. 4D, 4D' and 4E'.

Techniques described herein offer several advantages. For example, techniques herein can be used to form buried power rails, self-aligned cuts, isolation between target shapes (e.g. dummy metal during manufacturing), etc. Techniques herein can also enable the formation of a self-aligned block structure or multi-color patterning by using a wet-dry bilayer photoresist stack, therefore simplifying the fabrication process.

Figure 5:
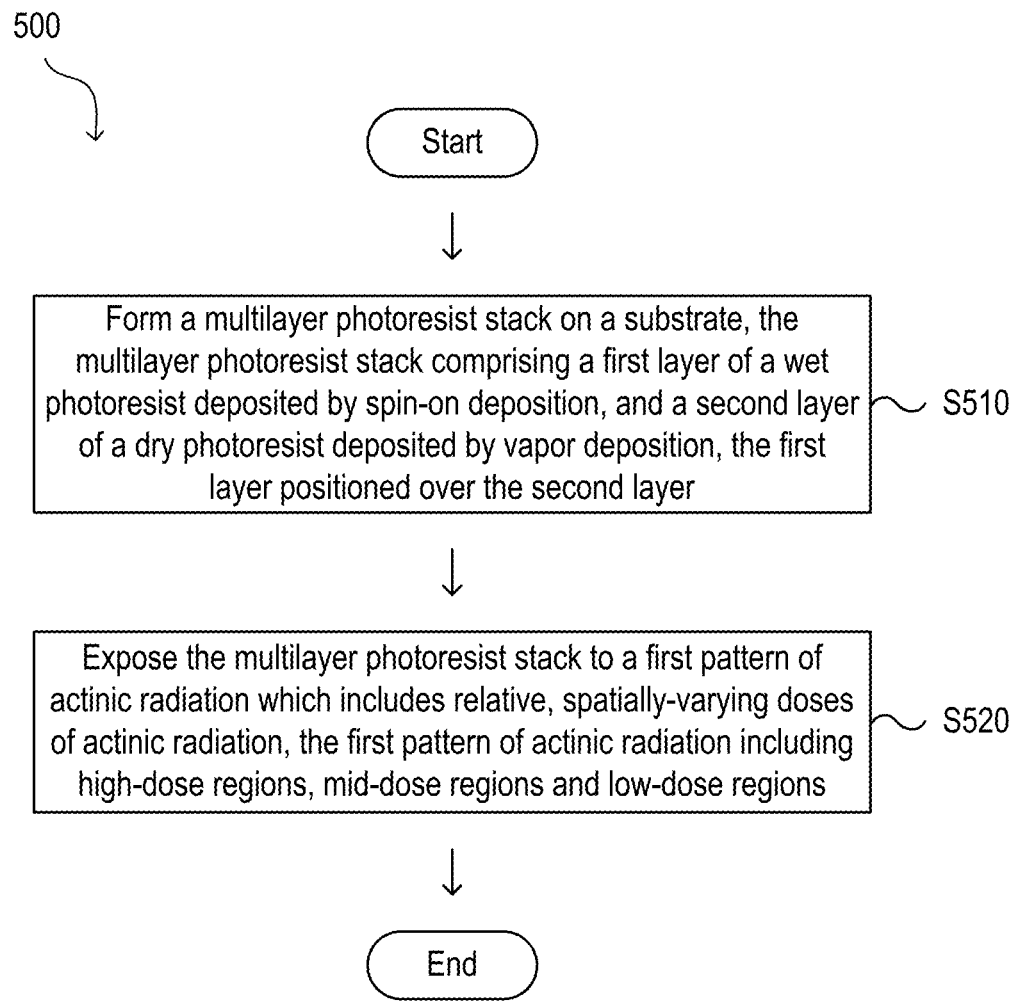
FIG. 5 shows a flow chart of a process for patterning a substrate, in accordance with yet another embodiment of the present disclosure.

FIG. 5 shows a flow chart of a process 500 for patterning a substrate, in accordance with yet another embodiment of the present disclosure. FIGS. 6A, 6B, 6C, 6D and 6E show vertical cross-sectional views of a substrate 600 at various intermediate steps of patterning such as the process 500, in accordance with exemplary embodiments of the present disclosure. Particularly, FIGS. 6A-6E can illustrate dual-tone advantages with a two-species bilayer photoresist stack.

The process 500 begins with Step S510 where a multilayer photoresist stack is formed on a substrate. The multilayer photoresist stack includes a first layer of a wet photoresist deposited by spin-on deposition, and a second layer of a dry photoresist deposited by vapor deposition. The first layer is positioned over the second layer. Step S510 herein can correspond to Step S110 in FIG. 1 and Step 310 in FIG. 3.

Figure 6A:
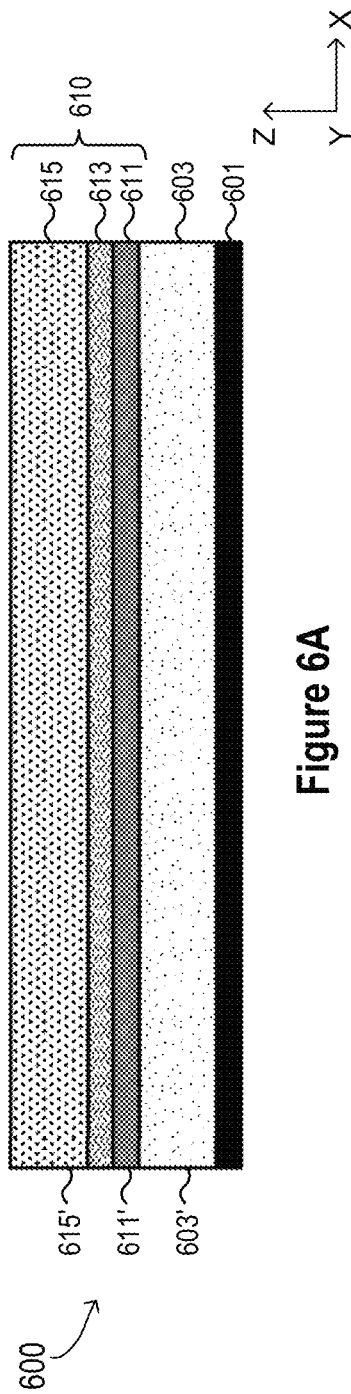

FIG. 6A can show some embodiments of Step S510. As illustrated, the substrate 600 includes a wafer 601 and a multilayer photoresist stack 610 formed over the wafer 601. Specifically, a dry photoresist layer 611 of the multilayer photoresist stack 610 is formed on the substrate 600 by vapor deposition. Then, a wet photoresist layer 615 of the multilayer photoresist stack 610 is formed over the dry photoresist layer 611 by spin-on deposition. Thus, the multilayer photoresist stack 610 is also referred to as a bilayer photoresist stack 610 in this example. In addition, the multilayer photoresist stack 610 may further include an ARC layer 613 (not shown in subsequent figures), and an underlying layer 603 of a third material 603' may optionally be disposed below the multilayer photoresist stack 610.

In some embodiments, FIG. 6A can correspond to FIG. 2A (and FIG. 4A). Specifically, the wafer 601 corresponds to the wafer 201. The underlying layer 603 corresponds to the underlying layer 203. The multilayer photoresist stack 610 corresponds to the multilayer photoresist stack 610. The dry photoresist layer 611 corresponds to the dry photoresist layer 211. The wet photoresist layer 615 corresponds to the wet photoresist layer 215. The ARC layer 613 corresponds to the ARC layer 213. Note that the wet photoresist layer 615 includes a wet photoresist 615' and is also referred to as a first layer 615 of the wet photoresist 615'. The dry photoresist layer 611 includes a dry photoresist 611' and is also referred to as a second layer 611 of the dry photoresist 611'.

The process 500 in FIG. 5 then proceeds to Step S520 by exposing the multilayer photoresist stack to a first pattern of actinic radiation which includes relative, spatially-varying doses of actinic radiation. The first pattern of actinic radiation includes high-dose regions, mid-dose regions and low-dose regions. Particularly, the multilayer photoresist stack and the first pattern of actinic radiation are configured such that after the exposing the multilayer photoresist stack to the first pattern of actinic radiation: in the high-dose regions, developability of both the first layer and the second layer is changed; in the mid-dose regions, developability of the first layer is changed while developability of the second layer is unchanged; and in the low-dose regions, developability of both the first layer and the second layer is unchanged.

Figure 6B:
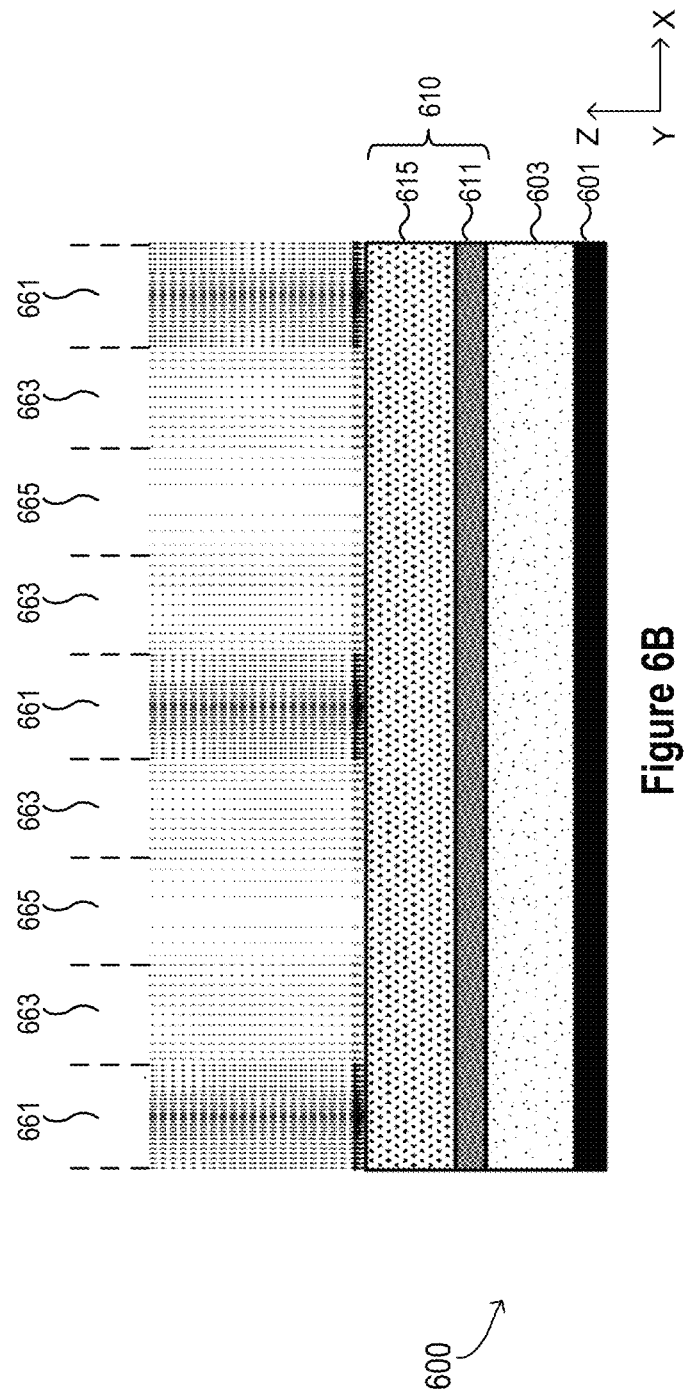
Figure 6B:
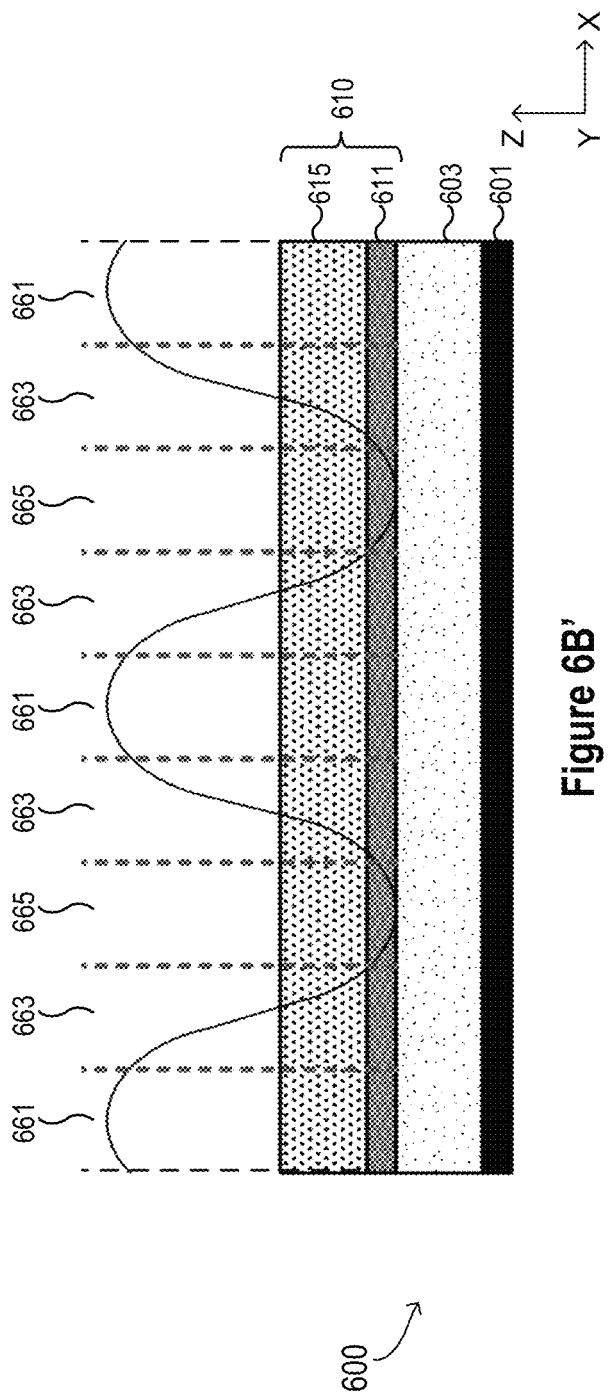

FIG. 6B can show some embodiments of Step S520. After forming the bilayer photoresist stack 610, the bilayer photoresist stack 610 is exposed to a first pattern of actinic radiation. A dose gradient of the first pattern of actinic radiation is represented by varying density of dotted lines. As shown, the first pattern of actinic radiation can include relative, spatially-varying doses of actinic radiation, such as high-dose regions 661, mid-dose regions 663 and low-dose regions 665. The high-dose regions 661 of radiation have sufficient energy to affect both the wet photoresist layer 615 and the dry photoresist layer 611, for example by changing developability. The mid-dose regions 663 can affect the wet photoresist layer 615, but have insufficient dose to affect the dry photoresist layer 611 underneath in those locations. The low-dose regions 665 may have insufficient radiation or no radiation (e.g. a no-dose region) to affect either the wet photoresist layer 615 or the dry photoresist layer 611. In a non-limiting example, the dose gradient includes an essentially or substantially sinusoidal profile in the XZ plane, as demonstrated in FIG. 6B' which shows a waveform representing intensity of exposure across the substrate segment in FIG. 6B.

Further, the wet photoresist layer 615 and the dry photoresist layer 611 can be configured to be sensitive to actinic radiation of a same wavelength (also referred to as a first wavelength). For example, the same wavelength can be between 10 and 124 nanometers, such as 13.5 nanometers. In other words, the first pattern of actinic radiation can include a pattern of EUV radiation.

Figure 6C:
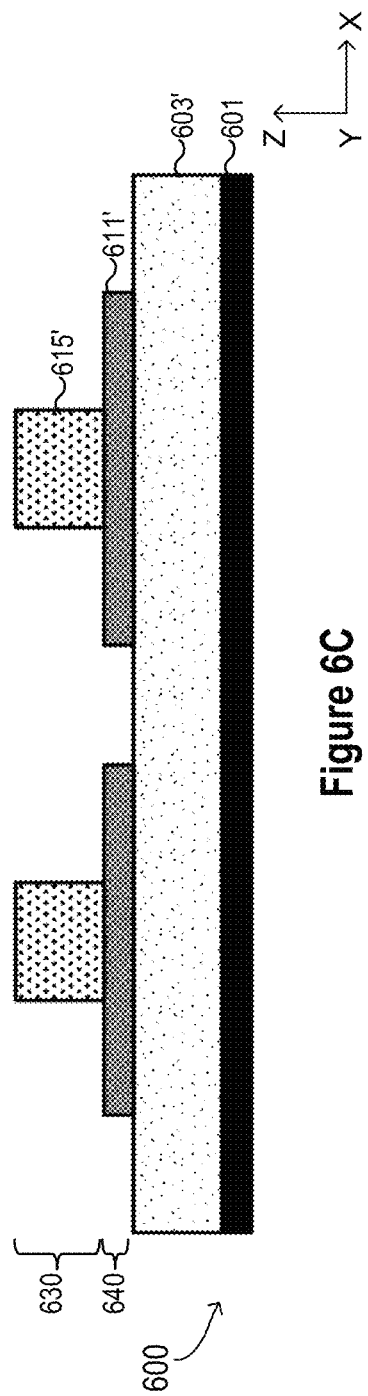

In FIG. 6C, the bilayer photoresist stack 610 is developed. First, the wet photoresist layer 615 is developed to form a first relief pattern 630 by a first development process, such as wet etch or dry etch, preferably using a corresponding liquid developer. Next, the dry photoresist layer 611 is developed to form a second relief pattern 640 by a second development process, such as wet etch (e.g. using a developer) or dry etch (e.g. plasma etching, ion beam etching or reactive ion etching). Note that the first relief pattern 630 and the second relief pattern 640 together form a combined relief pattern that is formed with a single exposure (i.e. the first pattern of actinic radiation).

In a non-limiting example, the wet photoresist layer 615 and the dry photoresist layer 611 both include positive resist material. Consequently, in the high-dose regions 661 and the mid-dose regions 663, the wet photoresist layer 615 is removed by the first development process; in the high-dose regions 661, the dry photoresist layer 611 is removed by the second development process. As a result, portions of the underlying layer 603 are uncovered. Moreover, three materials (i.e. the wet photoresist 615', the dry photoresist 611' and the third material 603') are exposed and accessible from a top view or directional etching perspective.

Additionally, in some embodiments, one or more intermediate layers (e.g. the ARC layer 613) between the wet photoresist layer 615 and the dry photoresist layer 611 are etched or developed using the first relief pattern 630 as an etch mask before the dry photoresist layer 611 is developed.

Subsequently, further masking and patterning can be executed, similar to what have been described for FIGS. 4C'-4E'. In some embodiments, a selective patterning process can be executed for uncovered portions of one or two of the wet photoresist 615', the dry photoresist 611' and the third material 603'. In some embodiments, a patterned layer can be formed on the substrate 600 to protect certain areas of the substrate 600 from the selective patterning process. For example in FIG. 6D, a patterned layer 606 (e.g. another relief pattern or a subsequent mask) can be formed on the substrate 600 to open selected portions (e.g. 611a) of the combined relief pattern.

Subsequently, various patterning processes can be enabled. In one example (FIG. 6E), the substrate 600 in FIG. 6D can be used to remove additional portions (e.g. an uncovered portion 611a) of the dry photoresist 611'. As a result, the third material 603' is further uncovered (as shown by 603a). In another example (FIG. 6Ei), a fourth material 608' is selectively deposited on only the uncovered portions (e.g. 611a) of the dry photoresist 611'. In yet another example (FIG. 6Eii), uncovered portions (e.g. 603a) of the third material 603' are selectively etched, and cuts or openings (e.g. 657a) are formed in the underlying layer 603. Therefore, a portion of the patterns (e.g. the combined relief pattern and the patterned layer 606) is transferred into the underlying layer 603. FIGS. 6E, 6Ei and 6Eii are just a few example patterning options. As can be appreciated, any number of additional patterning techniques can be coupled with bilayer resist stacks (e.g. 610) of two different resist species herein.

Further, in some embodiments, the bilayer photoresist stack 610 can be exposed to a second pattern of actinic radiation and developed to make changes to the combined relief pattern. The second pattern of actinic radiation may be executed with or without the patterned layer 606. The second pattern of actinic radiation may be executed before or after the selective patterning process. In some embodiments, at least one of the wet photoresist 615' and the dry photoresist 611' is configured to be sensitive to two different wavelengths (e.g. 198 nm and 13.5 nm). The second pattern of actinic radiation may accordingly include using a different wavelength from the first wavelength or using a same wavelength as the first wavelength.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of patterning a substrate, the method comprising:
    forming a multilayer photoresist stack on a substrate, the multilayer photoresist stack comprising a first layer of a wet photoresist deposited by spin-on deposition, and a second layer of a dry photoresist deposited by vapor deposition, the first layer positioned over the second layer; and
    exposing the multilayer photoresist stack to a first pattern of actinic radiation which includes relative, spatially-varying doses of actinic radiation, the first pattern of actinic radiation including high-dose regions, mid-dose regions and low-dose regions,
    wherein the multilayer photoresist stack and the first pattern of actinic radiation are configured such that after the exposing the multilayer photoresist stack to the first pattern of actinic radiation,
    in the high-dose regions, developability of both the first layer and the second layer is changed,
    in the mid-dose regions, developability of the first layer is changed while developability of the second layer is unchanged, and
    in the low-dose regions, developability of both the first layer and the second layer is unchanged.

2. The method of claim 1, wherein the first layer and the second layer are sensitive to actinic radiation of a same wavelength.

3. The method of claim 2, wherein the same wavelength is between 10 and 124 nanometers.

4. The method of claim 3, wherein the same wavelength is 13.5 nanometers.

5. The method of claim 1, further comprising:
developing the first layer to form a first relief pattern; and
developing the second layer to form a second relief pattern, resulting in uncovering portions of an underlying layer of a third material, the first relief pattern and the second relief pattern together forming a combined relief pattern.

6. The method of claim 5, further comprising executing a selective patterning process for uncovered portions of one or two of the wet photoresist, the dry photoresist and the third material.

7. The method of claim 6, further comprising forming a patterned layer on the substrate to expose selected areas of the substrate to the selective patterning process.

8. The method of claim 6, wherein the executing the selective patterning process includes selectively depositing a fourth material on the uncovered portions of one or two of the wet photoresist, the dry photoresist and the third material.

9. The method of claim 6, wherein the executing the selective patterning process includes selectively etching the uncovered portions of one or two of the wet photoresist, the dry photoresist and the third material.

10. The method of claim 6, wherein the executing the selective patterning process includes selectively replacing the uncovered portions of one or two of the wet photoresist, the dry photoresist and the third material with a fourth material.

11. The method of claim 6, further comprising transferring the combined relief pattern into the underlying layer by anisotropic etch.

12. The method of claim 6, wherein the selective patterning process is executed for the uncovered portions of the dry photoresist.

13. The method of claim 5, further comprising etching one or more intermediate layers between the first layer and the second layer using the first relief pattern as an etch mask.

14. The method of claim 13, wherein the etching the one or more intermediate layers includes etching an anti-reflective coating layer.

15. The method of claim 5, further comprising exposing the multilayer photoresist stack to a second pattern of actinic radiation.

16. The method of claim 5, wherein:
the developing the first layer includes a vapor-phase removal of developable portions of the first layer or includes using a liquid developer to remove developable portions of the first layer, and
the developing the second layer includes a vapor-phase removal of developable portions of the second layer or includes using a liquid developer to remove developable portions of the second layer.

17. The method of claim 1, wherein after the exposing the multilayer photoresist stack to the first pattern of actinic radiation:
in the high-dose regions and the mid-dose regions, the first layer is configured to become developable, and
in the high-dose regions, the second layer is configured to become developable.

18. The method of claim 1, wherein the first pattern of actinic radiation includes a dose gradient that is substantially sinusoidal in a plane perpendicular to a working surface of the substrate.

19. A method of patterning a substrate, the method comprising:
forming a multilayer photoresist stack on a substrate, the multilayer photoresist stack including a dry photoresist layer deposited by vapor deposition, and a wet photoresist layer deposited by spin-on deposition, the wet photoresist layer positioned over the dry photoresist layer; and
exposing the multilayer photoresist stack to a pattern of actinic radiation, the pattern of actinic radiation including differing relative doses of actinic radiation at spatial locations on the substrate include high-dose regions, mid-dose regions and low-dose regions,
wherein a composition of the multilayer photoresist stack is selected such that as a result of exposure to the pattern of actinic radiation,
in the high-dose regions, developability of both the dry photoresist layer and the wet photoresist layer is unchanged,
in the mid-dose regions, developability of the wet photoresist layer is changed while developability of the dry photoresist layer is unchanged, and
in the low-dose regions, developability of both the dry photoresist layer and the wet photoresist layer is changed.

20. The method of claim 19, wherein the wet photoresist layer and the dry photoresist layer are both sensitive to actinic radiation using a 13.5 nm wavelength light.

* * * * *